(12) United States Patent
Totzeck et al.

(10) Patent No.: US 6,992,834 B2
(45) Date of Patent: Jan. 31, 2006

(54) OBJECTIVE WITH BIREFRINGENT LENSES

(75) Inventors: Michael Totzeck, Schwaebisch Gmuend (DE); Vladimer Kamenov, Essingen (DE); Daniel Kraehmer, Aalen (DE); Wilhelm Ulrich, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 11/071,523

(22) Filed: Mar. 2, 2005

(65) Prior Publication Data

US 2005/0200966 A1 Sep. 15, 2005

Related U.S. Application Data

(63) Continuation of application No. PCT/EP02/14638, filed on Dec. 20, 2002.

(51) Int. Cl.
*G02B 21/02* (2006.01)

(52) U.S. Cl. ..................... 359/656; 359/649
(58) Field of Classification Search ......... 359/656–661
See application file for complete search history.

(56) References Cited

U.S. PATENT DOCUMENTS

| | | | |
|---|---|---|---|
| 6,201,634 B1 | 3/2001 | Sakuma et al. | |
| 6,646,718 B2 | 11/2003 | Schuster et al. | |
| 6,697,199 B2 * | 2/2004 | Gerhard et al. | 359/499 |
| 2004/0150806 A1 | 8/2004 | Brunotte et al. | |
| 2004/0207928 A1 * | 10/2004 | Schultz et al. | 359/649 |
| 2005/0157401 A1 * | 7/2005 | Goehnermeier et al. | 359/656 |

FOREIGN PATENT DOCUMENTS

| | | |
|---|---|---|
| EP | 1 006 388 | 6/2000 |
| EP | 1 235 092 | 8/2002 |
| EP | 1 237 043 | 9/2002 |
| WO | WO 02/093209 | 11/2002 |

OTHER PUBLICATIONS

Burnett, John et al. "Intrinsic birefringence in calcium fluoride and barium fluoride." Physical Review B, 64:241102, pp. 1-4.

Burnett, John et al. "The trouble with calcium fluoride." SPIE's OEMagazine, Mar. 2002, pp. 23-25.

* cited by examiner

*Primary Examiner*—Jordan M. Schwartz
(74) *Attorney, Agent, or Firm*—Fish & Richardson P.C.

(57) ABSTRACT

Objective (1, 601), in particular a projection objective for a microlithography projection apparatus, with first birefringent lenses (L108, L109, L129, L130) and with second birefringent lenses (L101–L107, L110–L128). The first lenses (L108, L109, L129, L130) are distinguished from the second lenses (L101–L107, L110–L128) by the lens material used or by the material orientation. After passing through the first lenses (L108, L109, L129, L130) and the second lenses (L101–L107, L110–L128), an outer aperture ray (5, 7) and a principal ray (9) are subject to optical path differences for two mutually orthogonal states of polarization. The difference between these optical path differences is smaller than 25% of the working wavelength. In at least one first lens (L129, L130), the aperture angle of the outer aperture ray (5, 7) is at least 70% of the largest aperture angle occurring for said aperture ray in all of the first lenses (L108, L109, L129, L130) and second lenses (L101–L107, L110–L128). This arrangement has the result that the first lenses (L108, L109, L129, L130) have a combined material volume of no more than 20% of the combined total material volume of the first lenses (L108, L109, L129, L130) and second lenses (L101–L107, L110–L128).

37 Claims, 13 Drawing Sheets

OBJECTIVE WITH BIREFRINGENT LENSES

CROSS REFERENCE TO RELATED APPLICATIONS

This application is a Continuation of and claims the benefit of priority under 35 USC 120 to co-pending International Application No. PCT/EP2002/014638 filed Dec. 20, 2002, which claims priority from German Application No. 102 41 102.6 filed Sep. 3, 2002, and which also claims priority from German Application No. 102 53 353.9 filed Nov. 14, 2002. The aforementioned applications are incorporated herein by reference in their entirety.

The invention relates to an objective with birefringent lenses, to a microlithography projection apparatus equipped with the objective, to a method of manufacturing semiconductor components with the microlithography projection apparatus, as well as a method for the compensation of birefringent effects in objectives with birefringent lenses.

Birefringent lenses have the effect that a non-polarized light ray is split into two rays that differ in their respective states of polarization, their phase velocities and their directions. If birefringent lenses are used in an objective, the splitting of the light rays and phases causes a deterioration in image resolution unless appropriate corrective mechanisms are provided. The birefringent effect of lenses can be the result of a variety of factors. It can be associated with the lens material, but it can also be caused by the anti-reflex coating of lenses. The birefringent effect in lenses can for example be the result of a stress-induced birefringence associated with the manufacturing method or with mechanical forces acting on the lens. The birefringence phenomenon plays a prominent role particularly in the field of crystal optics. Anisotropic crystals are birefringent. But isotropic crystals, too, have an intrinsic birefringence that becomes noticeable particularly at wavelengths in the DUV (deep ultraviolet) range. Given the fact that fluoride crystals with a cubic crystal structure, such as calcium fluoride and barium fluoride, are preferred lens materials for projection objectives with working wavelengths in the deep ultraviolet range, the intrinsic birefringence that causes undesirable effects in calcium fluoride and barium fluoride at these wavelengths needs to be compensated by suitable measures.

In the discussion of intrinsic birefringence, it is of critical importance to identify the crystallographic directions in a clear, unambiguous manner. Therefore, the following paragraphs are devoted to introducing a system of notations used to identify crystallographic directions, crystallographic planes, and lenses whose lens axes are oriented in a specific crystallographic direction.

The indices for the crystallographic directions will hereinafter be bracketed between the symbols "<" and ">", and the indices for the crystallographic planes will be bracketed between the symbols "{" and "}". The crystallographic directions are perpendicular to the correspondingly indexed crystallographic planes. For example, the crystallographic direction <100> is perpendicular to the crystallographic plane {100}. Crystals with a cubic lattice structure, which includes the fluoride crystals that are of interest in the present context, have the principal crystallographic directions <110>, <1$\bar{1}$0>, <$\bar{1}$$\bar{1}$0>, <101>, <10$\bar{1}$>, <$\bar{1}$01>, <$\bar{1}$0$\bar{1}$>, <1$\bar{1}$0>, <011>, <0$\bar{1}$1>, <01$\bar{1}$>, <0$\bar{1}$$\bar{1}$>, <111>, <$\bar{1}$11>, <$\bar{1}$$\bar{1}$1>, <$\bar{1}$1$\bar{1}$>, <1$\bar{1}$$\bar{1}$>, <1$\bar{1}$1>, <11$\bar{1}$>, <100>, <010>, <001>, <$\bar{1}$00>, <0$\bar{1}$0>, and <00$\bar{1}$>.

Because of the symmetries of cubic crystals, the principal crystallographic directions <100>, <010>, <001>, <$\bar{1}$00>, <0$\bar{1}$0>, and <00$\bar{1}$> are equivalent to each other. Therefore, those crystallographic directions that are oriented along one of the principal directions <100>, <010>, <001>, <$\bar{1}$00>, <0$\bar{1}$0>, and <00$\bar{1}$> will hereinafter be identified by the prefix "(100)-". Accordingly, crystallographic planes that are perpendicular to one of these principal crystallographic directions will be identified by the prefix "(100)-", and lenses whose lens axes are parallel to one of these principal crystallographic directions are likewise identified by the prefix "(100)-".

The principal crystallographic directions <110>, <$\bar{1}$10>, <1$\bar{1}$0>, <$\bar{1}$$\bar{1}$0>, <101>, <10$\bar{1}$>, <$\bar{1}$01>, <011>, <$\bar{}$1$\bar{}$1>, <01$\bar{1}$>, and <0$\bar{1}$$\bar{1}$> are likewise equivalent to each other. Therefore, those crystallographic directions that are oriented along one of the latter group of principal directions will hereinafter be identified by the prefix "(110)-". Accordingly, crystallographic planes that are perpendicular to one of these directions will also be identified by the prefix "(110)-", and lenses whose lens axes are parallel to one of these principal crystallographic directions are likewise identified by the prefix "(110)-".

Finally, the principal crystallographic directions <111>, <$\bar{1}$$\bar{1}$$\bar{1}$>, <$\bar{1}$$\bar{1}$1>, <$\bar{1}$1$\bar{1}$>, <$\bar{1}$11>, <1$\bar{1}$1>, <11$\bar{1}$> are also equivalent to each other. Therefore, those crystallographic directions that are oriented along one of the latter group of principal directions will hereinafter be identified by the prefix "(111)-". Accordingly, crystallographic planes that are perpendicular to these principal crystallographic directions will be identified by the prefix "(111)-", and lenses whose lens axes are parallel to one of these principal crystallographic directions are likewise identified by the prefix "(111)-".

Any statements made hereinafter in regard to one of the aforementioned principal crystallographic directions should be understood to be equally applicable to the equivalent principal crystallographic directions.

Further within this context, the crystallographic directions (111) are not equivalent to the crystallographic directions (100). Likewise, the crystallographic directions (100) are not equivalent to the crystallographic directions (110).

It is known from the published article "Intrinsic birefringence in calcium fluoride and barium fluoride" by J. Burnett et al. (Physical Review B, Volume 64 (2001), pages 241102-1 to 241102-4) that lenses of crystalline calcium fluoride and crystalline barium fluoride exhibit intrinsic birefringence. The intrinsic birefringence in this case is strongly dependent on the material orientation of the fluoride crystal lens and on the direction of the light ray. The birefringent effect is strongest on a light ray that passes through a lens in the (110)-direction. The measurements presented in the aforementioned publication show that for a light ray traveling in the (110)-direction in crystalline calcium fluoride, the birefringence amounts to (11.8±0.4) nm/cm at a wavelength of $\lambda$=156.1 nm, to (3.6±0.2) nm/cm at a wavelength of $\lambda$=193.09 nm, and to (0.55±0.07) nm/cm at a wavelength of $\lambda$=253.65 nm. On the other hand, for a propagation of the light ray in either of the directions (100) and (111), calcium fluoride exhibits no intrinsic birefringence, in accordance with what the theory predicts. Thus, the intrinsic birefringence shows a strong directional dependence and a marked increase towards shorter wavelengths.

In the article "The trouble with calcium fluoride" by J. Burnett et al. (SPIE's oe magazine, March 2002, pages 23–25, http:oemagazine.com/fromTheMagazine/mar02/biref.html), FIG. 4 illustrates the angle-dependent nature of the intrinsic birefringence in a fluoride crystal with a cubic crystal structure. In this case, the intrinsic birefringence of a light ray is dependent on the aperture angle as well as the azimuth angle of a light ray. As is clear from FIG. 4, the intrinsic birefringence has a fourfold azimuthal symmetry in the case where the lens axis runs in the (100)-direction, a threefold symmetry if the lens axis runs in the (111)-direction, and a twofold azimuthal symmetry if the lens axis runs in the (110)-direction. It is important to note, that by rotating two fluoride crystal lenses relative to each other about their lens axes, the undesirable effects of the intrinsic birefringence phenomenon can be reduced. In the case of two lenses whose lens axes are oriented in the (100)-direction, an advantageous choice for the angle of rotation is 45°; for two lenses whose lens axes are oriented in the (111)-direction the advantageous choice is 60°; and for two lenses whose lens axes are oriented in the (110)-direction it is 90°. By simultaneously using pairs of (100)-, (111)-, and (110) lenses, the optical path difference for two mutually orthogonal states of polarization can be reduced. As a further possibility, the simultaneous use of calcium fluoride lenses and barium fluoride lenses also leads to a compensation of the unwanted influence of the intrinsic birefringent properties, since the coefficients of birefringence for comparable crystallographic directions in calcium fluoride and barium fluoride have opposite signs, as shown in FIG. 2 of the aforementioned article.

Thus, it has become known from the articles of J. Burnett that the unwanted influence of the intrinsic birefringent properties can be reduced by simultaneously using first lenses and second lenses with different lens materials or different material orientations.

Projection objectives and microlithography projection systems are known for example from the patent application WO 01/50171 A1 (U.S. Ser. No. 10/177,580) by the applicant of the present invention and from the references cited therein. The embodiments shown in that patent application illustrate suitable purely refractive as well as catadioptric projection objectives with numerical apertures of 0.8 and 0.9 at operating wavelengths of 193 nm as well as 157 nm. The material used for the lenses is calcium fluoride.

In the patent application PCT/EP 02/05050 by the same applicant, which has not been pre-published, a variety of compensation methods are described for reducing the unwanted influence of the birefringent properties which occur, e.g., in the embodiments of the aforementioned reference WO 01/50171 A1 (U.S. Ser. No. 10/177,580). Among other possibilities, the parallel use of (100)-lenses together with (111)-lenses or (110)-lenses of the same kind of crystalline fluoride is disclosed, as well as the use of compensation coatings. The entire content of PCT/EP 02/05050 is hereby incorporated by reference in the present disclosure.

In the patent application DE 101 33 841.4 (U.S. Ser. No. 10/199,503) by the same applicant, which has not been pre-published, it is proposed to reduce the unwanted influence of intrinsic birefringence through the parallel use of lenses made of two different crystalline materials. Calcium fluoride and barium fluoride are proposed as a suitable pair of materials. The entire content of DE 101 33 841.4 (U.S. Ser. No. 10/199,503) is hereby incorporated by reference in the present disclosure.

The rotation of lens elements relative to each other for the compensation of birefringence effects is also described in the not pre-published patent application DE 10123725.1 (PCT/EP 02/04900), whose entire content is hereby incorporated by reference in the present disclosure.

The compensation methods for reducing the unwanted influence of birefringence according to the foregoing description are based on the combined use of two kinds of lenses that differ either in their material orientation or in the material itself. However, the problem in putting these methods into practice lies in the fact that the availability of the materials with the special material orientation required for compensation depends on the specific material or the specific material orientation.

Thus, under the current situation, the cost and technical complexity of producing the base material for (100)-lenses of calcium fluoride is higher than for (111)-lenses of calcium fluoride. While the manufacturing processes for (111)-material have been mastered, because calcium fluoride of this material orientation has been in use for a long time, it is at least at the present time still a problem to produce (100)-material with the homogeneity of the refractive index and the stress-induced birefringence behavior that are required in lithography applications. It would therefore be advantageous if the compensation of intrinsic birefringence in an objective could be achieved by coupling a large quantity of (111)-material with a small quantity of (100)-material.

Likewise, the use of barium fluoride as a compensation partner material for calcium fluoride is at present not yet widely practiced in lenses for lithography applications. Availability is limited and the production is expensive. For these material combinations, too, it would be desirable to have an objective in which the compensation of intrinsic birefringence is achieved by coupling a large quantity of calcium fluoride material with a small quantity of barium fluoride material.

It is therefore the object of the present invention to propose objectives in which the unwanted influence of birefringence, in particular intrinsic birefringence, is significantly reduced by combining two kinds of lenses that differ from each other in the lens material or in the material orientation of the lens material, while at the same time the quantity of material used for one of the two kinds of lenses is minimized.

The foregoing objective is achieved in an objective according to claims 1, 8 and 12, in a microlithography projection apparatus according to claim 37, in a method of producing semiconductor components according to claim 38, as well as in a method of compensating the effects of birefringence in accordance with claim 39 and in an objective according to claim 51 that is compensated by using the method.

Advantageous further developed embodiments of the invention are characterized by the features of the dependent claims.

According to claim 1, the objective has first birefringent lenses and second birefringent lenses that differ from each other either in the material used in the lenses or in the material orientation. The different lens material or the different material orientation has the result that the birefringent effects are opposing each other so that as a consequence of using a specific combination of first and second lenses, the detrimental influence of birefringence is reduced.

As a measure to quantify the detrimental influence of birefringence in lenses one uses the difference between the respective optical path differences occurring in an outer aperture ray and a principal ray for two mutually orthogonal states of polarization when the outer aperture ray and the principal ray pass through the first and second lenses.

The term "outer aperture ray" means a light ray that originates from an object point and whose ray height (perpendicular distance from the lens axis) in the diaphragm plane of the objective equals an amount between 0.7 times the radius of the diaphragm and the full radius of the diaphragm. For an outermost aperture ray the ray height in the diaphragm plane of the objective is equal to the radius of the diaphragm. In this case the angle of the outermost aperture ray relative to the optical axis in the image plane of the objective corresponds to the numerical aperture as defined for the image side of the objective.

If the objective has a diaphragm plane but lacks a diaphragm, an outer aperture ray is defined as a light ray for which, originating from an object point and passing through the objective, the ray height (perpendicular distance from the lens axis) in the diaphragm plane equals an amount between 0.7 times the largest possible distance of an aperture ray from the optical axis and the largest possible distance of an aperture ray from the optical axis.

The term "principal ray" means a light ray that originates from an object point and intersects the optical axis of the objective in the diaphragm plane.

Accordingly, a bundle of light rays originating from an object point is delimited by outermost aperture rays and has a principal ray as its central ray.

There are objectives in which the principal rays are blocked by an obscuration in or near the diaphragm plane or due to other causes. In this case, the principal ray is considered to be that light ray which, originating from an object point, passes through the objective without being blocked and which has the smallest distance from the optical axis in the diaphragm plane of the objective.

The difference between the optical path differences caused by an individual lens or a plurality of lenses in an outer aperture ray and a principal ray for two mutually orthogonal states of polarization will hereinafter be referred to as the aperture-/principal-ray retardation.

In the present context, the term "aperture angle" when used in reference to an individual lens means the angle between a light ray and the lens axis (or the angle between a light ray and the normal vector of the surface of a material sample), and outside of the individual lens it means the angle between a light ray and the optical axis of the objective.

The outer aperture rays are used to quantify the detrimental influence of birefringence because they normally have large aperture angles within the lenses. The outer aperture rays are therefore strongly affected by the effects of birefringence precisely in those cases where the lenses themselves or a combination of lenses that are rotated relative to each other about their lens axes cause the kind of optical path differences for two mutually orthogonal states of polarization where the path difference increases with the aperture angle. The outermost aperture rays are most strongly affected by the effects of birefringence, since they have the largest aperture angles within the lenses. Principal rays on the other hand usually have small aperture angles in the lenses in comparison to the outer aperture rays. In a centered refractive objective, the principal ray for the axial point in all lenses has an aperture angle of 0°. Thus, the aforementioned concept of the aperture-/principal-ray retardation can be used to characterize the maximum amount of disturbance that occurs in a wave front as a result of birefringence.

As a result of using a combination of two different lens materials or two different material orientations in the lenses, the aperture-/principal-ray retardation after passing through the first and second lenses is kept smaller than 25% of the wavelength. This ensures an adequate image quality of the objective regardless of the birefringent properties of the individual lenses. Counting only the birefringence caused by the lens material and disregarding other effects such as optical path differences for two mutually orthogonal states of polarization caused by anti-reflex coatings or by mechanical stresses introduced through the lens mounts, the aperture-/principal-ray retardation is advantageously kept smaller than 10% of the wavelength.

In order to minimize the amount of material required for one of the kinds of lenses, in this case for the first lenses, at least one first lens has an aperture angle of the outer aperture ray that is more than 70% of the maximum of all aperture angles occurring for this aperture ray in the first and second lenses. This has the advantage that the aforementioned first lens because of its very large aperture angle generates a relatively large aperture-/principal-ray retardation. This retardation is subsequently compensated by a large number of second lenses with smaller aperture angles which accordingly have smaller retardations between their respective outer aperture rays and principal rays.

This concept offers the possibility to achieve an almost total compensation of the detrimental influence of birefringence with a material volume for the first lenses of no more than 20%, and preferably no more than 15%, of the combined material volume of the first and second lenses.

In the present context, the material volume of a lens is determined as the volume of a cylinder that precisely envelops the contours of the lens. Since lenses are manufactured from cylindrical blanks, the so-called envelope cylinder indicates the minimally required amount of material for the manufacture of the lens.

The choice of lenses includes, e.g., refractive or diffractive lenses as well as correction plates with free-form correction surfaces. Planar-parallel plates can likewise be considered as lenses if they are arranged in the light path of the objective. Elements used specifically for retardation such as $\lambda/4$-plates and $\lambda/2$-plates are also considered as lenses in this context. They affect the state of polarization almost equally in all light rays, and thus they normally produce a negligible aperture-/principal-ray retardation.

The invention can be advantageously applied to lenses of fluoride crystal material with a cubic crystal structure. These fluoride crystals, e.g., calcium fluoride, barium fluoride, or strontium fluoride exhibit intrinsic birefringence in particular at short wavelengths.

The lens axes of the fluoride crystal lenses used in the practice of the invention are oriented in one of the principal crystallographic directions <100>, <111> or <110> or in one of the principal crystallographic directions equivalent to <100>, <111> or <110>. The lens axes are considered to be aligned in a principal crystallographic direction if the maximum deviation between lens axis and principal crystallographic direction is smaller than 10', preferably smaller than 5°.

The lens axis may for example be defined as a symmetry axis in a rotationally symmetric lens. If the lens has no symmetry axis, the lens axis may be defined by the middle of an incident bundle of light rays or by a straight line oriented in the median direction of all light rays in the lens. The lens axis of a planar-parallel plate is perpendicular to the plane lens surfaces.

To compensate the unwanted influence of birefringence in accordance with the invention, first lenses consisting for example of fluoride crystal material are combined with second lenses of the same fluoride crystal material in an arrangement where the lens axes of the first lenses are oriented in principal crystallographic directions that are not equivalent to the principal crystallographic directions in which the lens axes of the second lenses are oriented. As an example, the lens axes of the first lenses may be oriented in the (100)-direction, with the lens axes of the second lenses being oriented in the (111)-direction or the (110)-direction. In other words, the objective uses a combination of first (100)-lenses with second (111)-lenses, or a combination of first (100)-lenses with second (110)-lenses, or a combination of first (100)-lenses with a combination of second (111)-lenses with second (110)-lenses. However, it is also possible for the lens axes of the first lenses to be oriented in the (111)-direction or the (110)-direction, with the second lenses oriented in the (100)-direction. In the latter arrangement, the objective has a combination of first (111)-lenses with second (100)-lenses, or a combination of first (110)-lenses with second (100)-lenses, or a combination of second (100)-lenses with a combination of first (111)-lenses with first (100)-lenses. These combinations are beneficial because they allow a nearly total compensation of the unwanted influence of birefringence, particularly if used together with the additional measure of rotating the lenses relative to each other about the lens axes. However, since it is currently more expensive to provide (100)-lens material, is advantageous if the first lenses are (100)-lenses.

A compensation of the unwanted influence of birefringence is also achieved by combining first lenses of fluoride crystal material with second lenses of a different fluoride crystal material in an arrangement where the lens axes of the first lenses are preferably oriented in the same or an equivalent principal crystallographic direction as the lens axes of the second lenses. As an example, first lenses of barium fluoride can be combined with second lenses of calcium fluoride. However, it is likewise possible to combine first lenses of calcium fluoride with second lenses of barium fluoride. In this kind of a combination, the lens axes of the first and second lenses are preferably aligned either in the (100)-direction or the (111)-direction. However, since it is currently more expensive to meet the quantity and quality requirements with barium fluoride, it is of advantage if the first lenses are made of barium fluoride.

It is advantageous if a light ray with an aperture angle between 0° and 15° in a first or second lens is subject to almost no optical path difference for two mutually orthogonal states of polarization. This will be the case, e.g., in fluoride crystals, if the lens axes are oriented in the (100)- or (111)-direction of the crystallographic structure. Under this condition, a large part of the light rays, in particular principal rays and aperture rays with small aperture angles, will pass through the objective with no optical path difference between two mutually orthogonal states of polarization. In this case, compensation is required primarily for the outer aperture rays.

An optimal degree of compensation of the unwanted effects of the birefringent properties is achieved if one or more homogeneous groups are formed among the first lenses or also among the second lenses, where a group is characterized by the fact that within the group, the aperture-/principal-ray retardation is nearly independent of the azimuth angle of the outer aperture ray.

The term "azimuth angle" in the present context, when used outside of an individual lens, means the angle measured in a plane extending perpendicular to the optical axis of the objective between a reference direction in this plane that is fixed in the objective and the projection of a light ray into the same plane. The reference direction is represented, e.g., by the y-direction in the object plane or the image plane, with the z-direction aligned parallel to the optical axis. Within a lens, the azimuth angle $\alpha_L$ means the angle measured from a reference direction that is fixed in the lens in a plane that extends perpendicular to the lens axis to a direction representing the projection of a light ray into the same plane. The reference direction of a lens may, e.g., be parallel to the projection of the (110)-crystallographic direction into a plane whose normal vector is oriented in the (100)- or (111)-direction, depending on whether the lens axis points in the first or second of the latter two directions. In any case, the reference directions of the fluoride crystal lenses whose lens axes are oriented in the same principal crystallographic direction are defined so that they are tied in an equivalent manner to the crystallographic structure.

The optical path differences for outer aperture rays of different azimuth angles should differ by no more than 30% of the maximum path difference for all of the outer aperture rays having the same aperture angles. By arranging the first lenses in homogenous groups and also arranging the second lenses in homogeneous groups, one achieves the result that for example (100)-lenses which, taken individually, have a fourfold azimuthal symmetry in their birefringent behavior can be compensated successfully with (111)-lenses which, also taken individually, have a threefold symmetry in their birefringent behavior.

In the practice of the foregoing concept, it is advantageous if all of the first lenses and all of the second lenses are assigned to homogeneous groups. Using several homogeneous groups has the advantage that the angle of rotation between the lenses of different homogeneous groups has almost no influence, so that this angle remains available as a degree of freedom for the optimization of the objective.

However, one could also assign all of the first lenses to a single homogeneous group and all of the second lenses to a single homogeneous group.

In order to achieve an azimuth-independent path difference for two mutually orthogonal states of polarization in an outer aperture ray in a homogeneous group of lenses whose lens axes point in the same or equivalent principal crystallographic directions, it is beneficial to subdivide the homogenous group into a number n of subgroups.

Under this concept, a subgroup has at least one lens, for example one, two or three lenses. The lenses within a subgroup are not rotated relative to each other except for a possible offset angle that is of no consequence because of the azimuthal symmetry of the distribution function $\Delta n(\theta_L, \alpha_L)$ of the birefringence of the fluoride crystal material. Thus, the angle of rotation γ between the lenses of a subgroup can take on any of the values according to the equation $$\gamma = 1 \cdot \frac{360°}{k} \pm 10°,$$

where l represents an integer and k represents the periodicity of the azimuthal symmetry of the birefringence distribution $\Delta n(\theta_L, \alpha_L)$ of a lens. An angle of rotation of 0° between two lenses means that equivalent principal crystallographic directions of the two lenses are oriented in the same directions. Two lenses belonging to two different subgroups on the other hand have an angle of rotation between each other that is described by the equation $$\gamma = \frac{360°}{k \cdot n} + m \cdot \frac{360°}{k} \pm 10°,$$

wherein m is an integer.

In the simplest case, a homogeneous group has two subgroups with one lens each. If the homogeneous group consists of two (100)-lenses, the angle of rotation between the two lenses is ideally 45°, or 135°, 225°, . . . etc.

If the homogeneous group consists of two (111)-lenses, the angle of rotation between the two lenses is ideally 60°, or 120°, 300°, . . . etc.

If the homogeneous group consists of two (110)-lenses, the angle of rotation between the two lenses is ideally 90°, or 270°, 450°, . . . etc.

If the mutual rotation of, e.g., two lenses does not lead to an aperture-/principal-ray retardation that is substantially independent of the azimuth angle of the outer aperture ray, this desired property can be achieved by assigning a further lens to a subgroup. This is possible in a case where the retardations caused by the individual subgroups between an outer aperture ray and a principal ray have nearly similar maximum values. Rotating all lenses of a subgroup in relation to the lenses of another subgroup leads to the end result that the retardations between the outer aperture rays and principal rays are nearly independent of the azimuth angle.

With the arrangement of homogeneous groups, it is possible to assign to the individual lenses of a homogeneous group a birefringence factor $BF_L$ which, except for parameters determined by the lens material and the material orientation, depends only on the aperture angle $\theta_L$ and the path length $OP_L$ of the outer aperture ray of the lens.

The birefringence factor $BF_L$ is defined as $$BF_L(\theta_L, OP_L) = MA_L \cdot DI_L \cdot SP_L(\theta_L, OP_L), \quad (1)$$

wherein $MA_L$ represents a material parameter, $DI_L$ an orientation parameter, and $SP_L(\theta_L, OP_L)$ a light ray parameter.

The material parameter $MA_L$ represents a measure for the magnitude of the birefringence in (110)-direction. The amount of the material parameter $MA_L$ depends on the material and on the wavelength of the light ray. The sign of the material parameter $MA_L$ depends on the direction of the birefringence in the (110)-direction. The material parameter is +2.4 nm/cm for lenses of CaF2, and −7.2 nm/cm for lenses of BaF2 for a wavelength of λ=157 nm.

The orientation parameter $DI_L$ depends on the material orientation. For a lens of fluoride crystal material whose lens axis runs in the (100)-direction, the orientation parameter is −3; for a lens whose lens axis run in the (111)-direction, it is +2; and for a lens whose lens axis runs in the (110)-direction, it is +¾.

The light ray parameter is defined as $$SP_L(\theta_L, OP_L) = OP_L \cdot \frac{7}{9}\sin^2\theta_L \cdot (7 \cdot \cos^2\theta_L - 1) \quad (2)$$

wherein $OP_L$ represents the path length of the outer aperture ray in the lens and GL represents the aperture angle of the outer aperture ray in the lens.

For aperture angles up to 40°, the light ray parameter is closely approximated by the equation $$SP_L(\theta_L, OP_L) = OP_L \cdot \sin^2(2,17 \cdot \theta_L) \quad (3)$$

As an alternative to expressing the functional dependencies between the light ray parameter $SP_L$ and the quantities $\theta_L$ and $OP_L$ through the equations (2) and (3), one could also use a polynomial series or other representation of the functional dependency that provides the best possible approximation for the given curves.

With an appropriate rotation of the lenses of a homogeneous group, it is possible to achieve that rays of at least one aperture angle $\theta_L$ will have an optical path difference of two mutually orthogonal states of polarization that is nearly independent of the azimuth angle $\alpha_L$. In accordance with the invention, these lenses are given an effective birefringence that remains dependent only on the aperture angle $\theta_L$ and the path length $OP_L$ of a light ray. The optical path difference for two mutually orthogonal states of polarization that will occur in a light ray passing through a lens with an effective birefringence as described above will be proportional to the functional relationship given in one of the equations (2) or (3) for the light ray parameter $SP_L$.

The larger the amount of the birefringence factor $BF_L$ of a lens, the larger will be the contribution of that lens to the aperture-/principal-ray retardation of the homogenous group that the lens belongs to.

Also, the sum of the birefringence factors $BF_L$ of the lenses of a homogeneous group provides an approximation for the aperture-/principal-ray retardation of the homogeneous group.

In order to achieve a significant reduction of the unwanted influence of birefringence, the sum of all birefringence factors of the first and second lenses should be close to zero. It is advantageous if the absolute value of the sum of all birefringence factors $BF_L$ of only the first lenses equals the absolute value of the sum of all birefringence factors $BF_L$ of the second lenses with a deviation of no more than ±10%. This percentage is based on whichever of the two sums has the larger absolute value. Within this deviation range, the compensation is considered to be adequate. If the birefringence factors of the first lenses are not compensated by the birefringence factors of the second lenses, there will be a net result of remaining retardation between outer aperture rays and principal rays after passing through the first and second lenses.

The compensation that results from the simultaneous use of first and second lenses is due to the fact that the respective multiplication products $MA_L \cdot DI_L$ for the first lenses and the second lenses have opposite signs.

If the first lenses consist of calcium fluoride and have lens axes running in the (100)-direction of the crystallographic structure, the product $MA_L \cdot DI_L$ has a negative sign, while in the second lenses, consisting likewise of calcium fluoride but having lens axes running either in the (111)-direction or in the (110)-direction, the product $MA_L \cdot DI_L$ has a positive sign.

If the first lenses consist of barium fluoride and have lens axes running in the (111)-direction of the crystallographic structure, the product $MA_L \cdot DI_L$ has a negative sign, while in the second lenses, consisting of calcium fluoride and having lens axes running likewise in the (111)-direction, the product $MA_L \cdot DI_L$ has a positive sign.

To achieve compensation by combining first lenses of (100)-lens material with second lenses of (111)-lens material, one finds that based on the different orientation parameters, the required ratio between the respective material volumes of the first lenses and the second lenses will be approximately ⅔, if one assumes on average equal light ray parameters for the first and second lenses, and if the first lenses are not arranged in accordance with the invention.

To achieve compensation by combining lenses of barium fluoride with lenses of calcium fluoride, one finds that based on the different material parameters for the wavelength of λ=157 nm, the required ratio between the respective material volumes of the first lenses of barium fluoride and the second lenses of calcium fluoride will be approximately ⅓, if one assumes on average equal light ray parameters for the first and second lenses, and if the first lenses are not arranged in accordance with the invention.

The birefringence factor $BF_L$ depends in a linear relationship on the path length $OP_L$ of the outer aperture ray in the lens and in an approximately quadratic relationship on the aperture angle $\theta_L$. To reduce the unwanted influence of birefringence and at the same time cut down on the material volume for the first lenses, it is particularly advantageous to arrange the first lenses at positions with a large aperture angle $\theta_L$, because this gives the first lenses large birefringence factors $BF_L$.

However, if the lens with a large aperture angle is a very thin lens, the light path $OP_L$ will be short and accordingly, the contribution to the birefringence compensation will be small.

If a lens has a small aperture angle but still has a large birefringence factor due to a long light path, the lens will nevertheless be unsuitable as a first lens because of its large material volume.

To find lenses that are suitable as first lenses one may use the criterion of a characteristic light ray quantity $CN_L = OP_L \sin^2(\theta_L)$ that is defined as the multiplication product of the light path length $OP_L$ of the outer aperture ray in the lens and the square of the aperture $\sin(\theta_L)$ of the outer aperture ray in the lens. If the characteristic light ray quantity of a lens is large, then the lens should be assigned to the lens group whose material volume is to be minimized. By defining the characteristic light ray quantity $CN_L$ in a manner where the aperture angle has twice the exponential power of the light path length, one achieves a large contribution to the compensation effect with a small amount of material. Advantageously, the lens with the largest characteristic quantity $CN_L$ should be a first lens. Furthermore, at least two among the first lenses should be lenses with a characteristic quantity $CN_L$ that is more than 90% of the maximum value occurring in all of the characteristic quantities.

It is advantageous if the characteristic quantities $CN_L$ in all of the second lenses are smaller than 75% of the maximum value occurring in all of the characteristic quantities of the objective.

Lenses with small aperture angles, i.e., with aperture angles that are smaller than 30% of the maximum aperture angle occurring in all of the first and second lenses, should likewise be designed as second lenses because they have small birefringence factors and contribute little to the compensation.

To obtain in a homogeneous group an aperture-/principal-ray retardation that is nearly independent of the azimuth angle of the outer aperture ray, it is advantageous to assign the lenses of the homogeneous group to n subgroups, each of which has at least one lens. The positive integer n represents the number of subgroups, with n being equal or larger than 2. Any two lenses of a subgroup are positioned relative to each other at an angle of rotation of $0° \pm 10°$, or $1\cdot360'/k \pm 10°$, so that equivalent principal crystallographic directions of the lenses in a subgroup are aligned in approximately the same directions. The lenses of a homogeneous group are advantageously assigned to the n subgroups in such a manner that the different subgroups have nearly equal sums of birefringence factors $BF_L$ for their respective lenses. In this case, the mutually rotated arrangement of the lenses from different subgroups will have the result that the aperture-/principal-ray retardation for the homogenous group is independent of the azimuth angle of the outer aperture ray. To achieve this result, it is sufficient if the ratio between the sum of the birefringence factors for the lenses of each individual subgroup and the sum of the birefringence factors for all lenses of the homogeneous group lies between 0.75/n and 1.25/n. However, if the sum of the birefringence factors for all lenses of the homogeneous group is larger than 2% of the wavelength, it is advantageous if the ratio of the sum of the birefringence factors for the lenses of each individual subgroup in relation to the sum of the birefringence factors for all lenses of the homogeneous group lies between 0.85/n and 1.15/n.

The largest aperture angles of an outer aperture ray occur in the areas of field planes. It is therefore advantageous if the lenses that are arranged next to these planes are first lenses.

To allow a homogeneous group of first lenses to be formed with at least two lenses, at least the two lenses next to a field plane should be first lenses. A field plane in this context means the object plane or the image plane of the objective, but it could also be an intermediate image plane. In the case of an intermediate image plane, the lenses of the homogeneous group with first lenses can be arranged in the light path before and after the intermediate image plane. It is particularly advantageous to arrange the first lenses in the area of the field plane where the largest numerical aperture occurs. In microlithography projection objectives, which produce a reduced image, the field plane with the largest numerical aperture is the image plane, or it could be an intermediate image plane if its numerical aperture is similar to the numerical aperture of the image plane.

The unwanted influence of birefringence, in particular the intrinsic birefringence of (100)- or (111)-lenses is particularly noticeable if the light rays inside the lenses have large aperture angles. This is the case in objectives that have a large numerical aperture on the image side, i.e., larger than 0.7 and in particular larger than 0.8.

The intrinsic birefringence increases significantly with a shorter working wavelength. For example the intrinsic birefringence for calcium fluoride at a wavelength of 193 nm is more than seven times as large, and at a wavelength of 157 nm it is more than 20 times as large as at a wavelength of 248 nm. The invention is therefore used to particular advantage if the light rays have wavelengths shorter than 200 nm, in particular shorter than 160 nm.

The objective in which the invention is being used can be a purely refractive projection objective consisting of a large number of lenses in a rotationally symmetric arrangement along the optical axis, or it can be a projection objective of the catadioptric type. If a projection objective of the catadioptric type comprises a beam splitter cube, such cube is not considered as a lens in the context of this invention.

In order to have many degrees of freedom available for the compensation of the birefringent effects, it is advantageous if the objective has at least ten second lenses. The second lenses will compensate the aperture-/principal-ray retardation that was caused by the no more than four first lenses.

Projection objectives of this type are advantageously used in microlithography projection systems with a light source followed by an illumination system, a mask-positioning system, a mask carrying a structure, a projection objective, an object-positioning system and a light-sensitive substrate.

A microlithography projection system of the foregoing description can be used to produce micro-structured semiconductor components.

The scope of the invention also includes a method for the compensation of birefringence effects that occur in objectives with birefringent lenses. The inventive method is used to particular advantage if the birefringent lenses of the objective consist of the same fluoride crystal material with a cubic structure. Because of their intrinsic birefringence, fluoride crystals show a deterioration in the image quality produced by the objective particularly at wavelengths below 200 nm. However, the harmful effects of birefringence can be compensated by using fluoride crystal lenses whose lens axes run in the (100)-direction in combination with fluoride crystal lenses whose lens axes run in the (111)-direction.

The method according to the invention provides a solution to the problem of determining the orientation of the lens axes for the individual fluoride crystal lenses of an objective so that the deterioration of the image quality of the objective due to the intrinsic birefringence of the lens material remains within a tolerable range.

The method is directed to an objective whose fundamental structure is known. Furthermore, for an outer aperture ray originating from an object point, the aperture angle $\theta_L$ and the path length $OP_L$ in each fluoride crystal lens are known.

The inventive method has the following steps:

A. In step A, the fluoride crystal lenses are assigned either to a first or second homogeneous group. Except for the condition that each homogeneous group has to have at least two lenses, the assignment can be arbitrary.

B. In step B, a compensation parameter $KP_L = DI_L \cdot SP_L$ is calculated for each lens of the first and second groups. The light ray parameter $SP_L$ is defined by the equation $$SP_L = OP_L \cdot \frac{7}{9} \sin^2\theta_L \cdot (7 \cdot \cos^2\theta_L - 1),$$

which may be approximated by $SP_L = OP_L \cdot \sin^2(2,17 \cdot \theta_L)$. The approximation may be used if the aperture angle is less than 40°. The orientation parameter $DI_L$ for the lenses of the first homogeneous group is $DI_L = -3$, and for the lenses of the second homogeneous group it is $DI_L = +2$.

C. In step C, the sum $\Sigma_{HGI}(KP_L)$ is calculated for the compensation parameters $KP_L$ of the lenses of the first homogeneous group, and the sum $\Sigma_{HGII}(KP_L)$ is calculated for the compensation parameters $KP_L$ of the lenses of the second homogeneous group.

D. In step D, a test is made as to whether the inequality $|\Sigma_{HGI}(KP_L) + \Sigma_{HGII}(KP_L)| < |10\% \Sigma_{HGI}(KP_L)|$ is true. In the affirmative case, the method is continued at step E. In the negative case, the method loops back to step A for a new assignment of the fluoride crystal lenses to the first or second homogeneous group. The method is terminated if all possible assignments have been tried and none of the assignments meets the criterion given in step D. In this case, the criterion for termination can be stretched, or an indication can be given to the user of the method that a compensation meeting the given specification is not possible with the existing design of the objective.

E. In step E, the lens axes of the lenses of the first homogeneous group are oriented in the (100)-direction and the lens axes of the lenses of the second homogeneous group are oriented in the (111)-direction of the crystallographic structure.

After the steps A to E have been carried out, the orientations of the lens axes of the fluoride crystal lenses are known.

In addition to compensating the unwanted influence of intrinsic birefringence, the method can also be used for the purpose of achieving a significant reduction in the amount of material required for the lenses of one of the homogenous groups in comparison to the amount of material required for the lenses of the other homogeneous group. To achieve this result, it is advantageous if the assignment of the lenses to the groups in step A is followed by a calculation of the respective material volume of each of the two groups and the method is not continued to step B unless the material volume of the group whose volume is to be reduced is no more than 20% of the combined material volume of the two homogeneous groups. For the purpose of this calculation, the material volume of a homogeneous group means the sum of the volumes of the enveloping cylinders of the lenses of the homogeneous group.

The method leads more rapidly to the desired result if the group assignment of the lenses is made so that in at least one lens of the homogenous group whose material volume is to be reduced, the outer aperture ray has an aperture angle equal to at least 70% of the largest aperture angle occurring for this aperture ray in the fluoride crystal lenses.

It is further advantageous if the group assignment of the lenses is made so that the lens whose characteristic light ray quantity $CN_L = OP_L \cdot \sin^2(\theta_L)$ has the largest of all values occurring in the objective is assigned to the homogenous group whose material volume is to be reduced.

It is advantageous if the homogeneous group whose material volume is to be reduced has at least two lenses whose characteristic quantities $CN_L$ are larger than 90% of the maximum among the occurring characteristic quantities.

The characteristic quantities $CN_L$ of all lenses who are assigned to the homogeneous group whose material volume is not to be reduced, are advantageously smaller than 75% of the maximum of the occurring characteristic quantities.

In subsequent steps of the method, the angles of rotation are determined between each two of the fluoride crystal lenses. By mutually rotating the lenses whose axes run in the same crystallographic direction, one achieves that the aperture-/principal-ray retardation is nearly independent of the azimuth angle of the outer aperture ray.

F. In step F, the lenses of a homogeneous group are assigned to one of n subgroups, with n being an integer equal to or larger than 2. In the standard version of the method n equals 2.

G. In step G, the sum $\Sigma_{UG}(KP_L)$ of the compensation parameters $KP_L$ of the lenses in a subgroup is calculated for each of the subgroups.

H. In step H, a test is made as to whether the inequality $0.75 \cdot \Sigma_{HG}(BF_L) < n \cdot \Sigma_{UG}(BF_L) < 1.25 \cdot \Sigma_{HG}(BF_L)$ is met for each of the subgroups. In the affirmative case, the method is continued at step I. In the negative case, the method loops back to repeat steps F to H, starting over in step F with a different selection of assigning the lenses of a homogeneous group to n subgroups. In addition to the standard number of n=2, the method can also be expanded to n=3. The method is terminated if all possible subgroup assignments have been tried and none of the selections meets the criterion given in step H. In this case, the criterion for termination can be made easier to pass, or an indication can be given to the user of the method that a compensation meeting the given specification is not possible with the current design of the objective.

I. In step I, the lenses of a homogeneous group are rotated relative to their lens axes so that the principal crystallographic directions of the lenses in each subgroup run in approximately the same directions. Consequently, the angle of rotation between two lenses in a subgroup is 0°.

J. In step J, all lenses of a subgroup are rotated relative to the lenses of another subgroup about their lens axes so that the angle of rotation between any two lenses of different subgroups is $\gamma_0/n + m\,\gamma_0$, where m is a positive integer. The angle $\gamma_0$ equals 120° if the lens axes are oriented in the (111)-direction, and 90° if the lens axes are oriented in the (100)-direction of the crystallographic structure.

The compensation can be further improved by reducing or increasing the thickness of one or more fluoride crystal lenses so that the inequality $|\Sigma_{HGI}(KP_L)+\Sigma_{HGII}(KP_L)|<|5\% \Sigma_{HGI}(KP_L)|$ is satisfied. It is particularly suitable to apply this measure to a lens in which the characteristic quantity $CN_L=OP_L\cdot\sin^2(\theta_L)$ is larger than 75% of the maximum among the characteristic quantities occurring in the fluoride crystal lenses.

After the thickness of one or more of the lenses has been changed, the method may include a re-optimization of the radii and possibly of the aspheric parameters of the lenses in order to improve the quality of the correction of the objective after the thickness change.

Examples of fluoride crystals that can be used are barium fluoride, calcium fluoride or strontium fluoride.

Objectives with fluoride crystal lenses in which the unwanted influence of intrinsic birefringence has been reduced in accordance with the method described are used with preference in microlithography projection systems.

The invention will now be explained in more detail with reference to the drawings, wherein.

Figure 6:
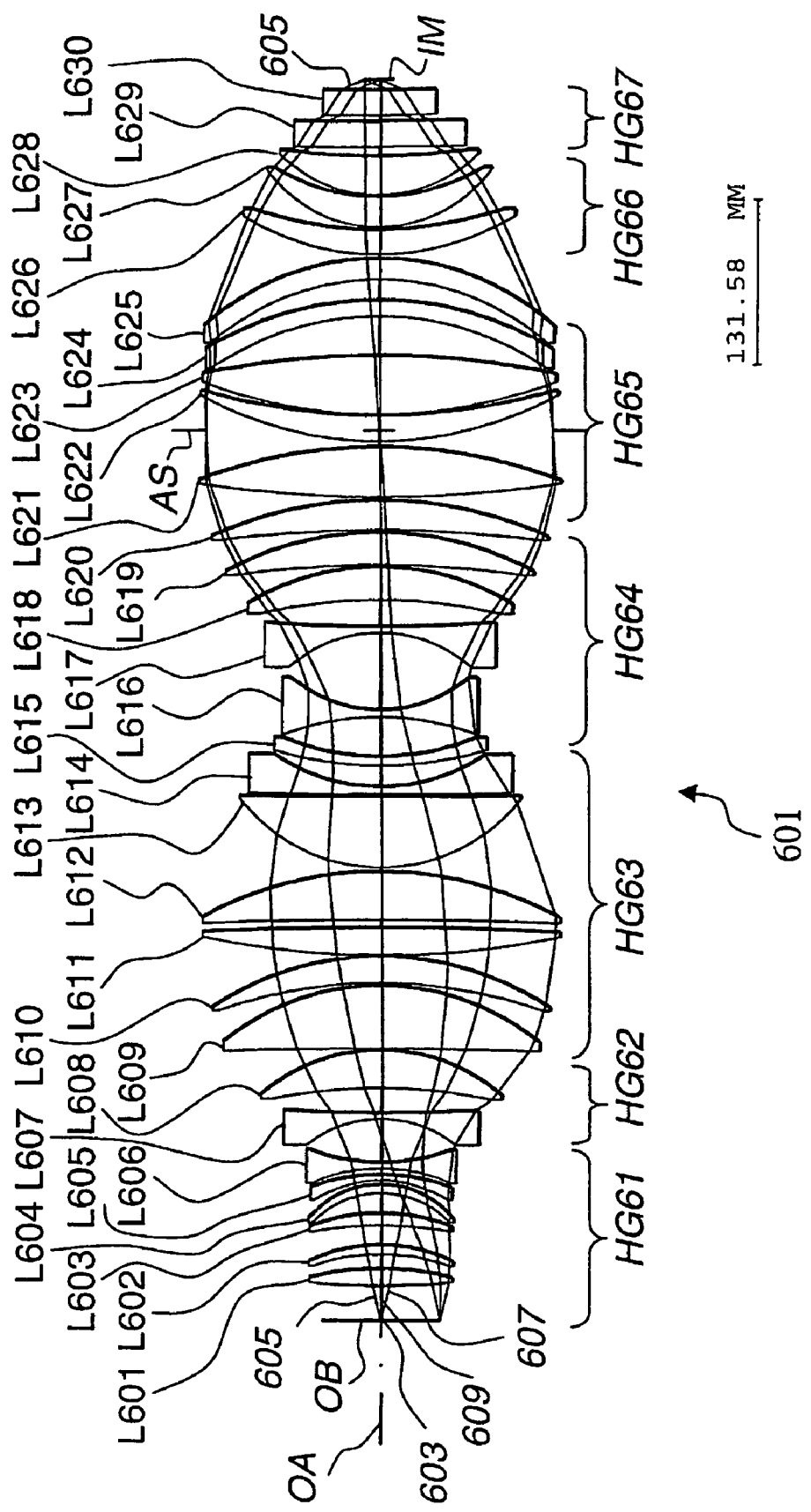
Figure 7:
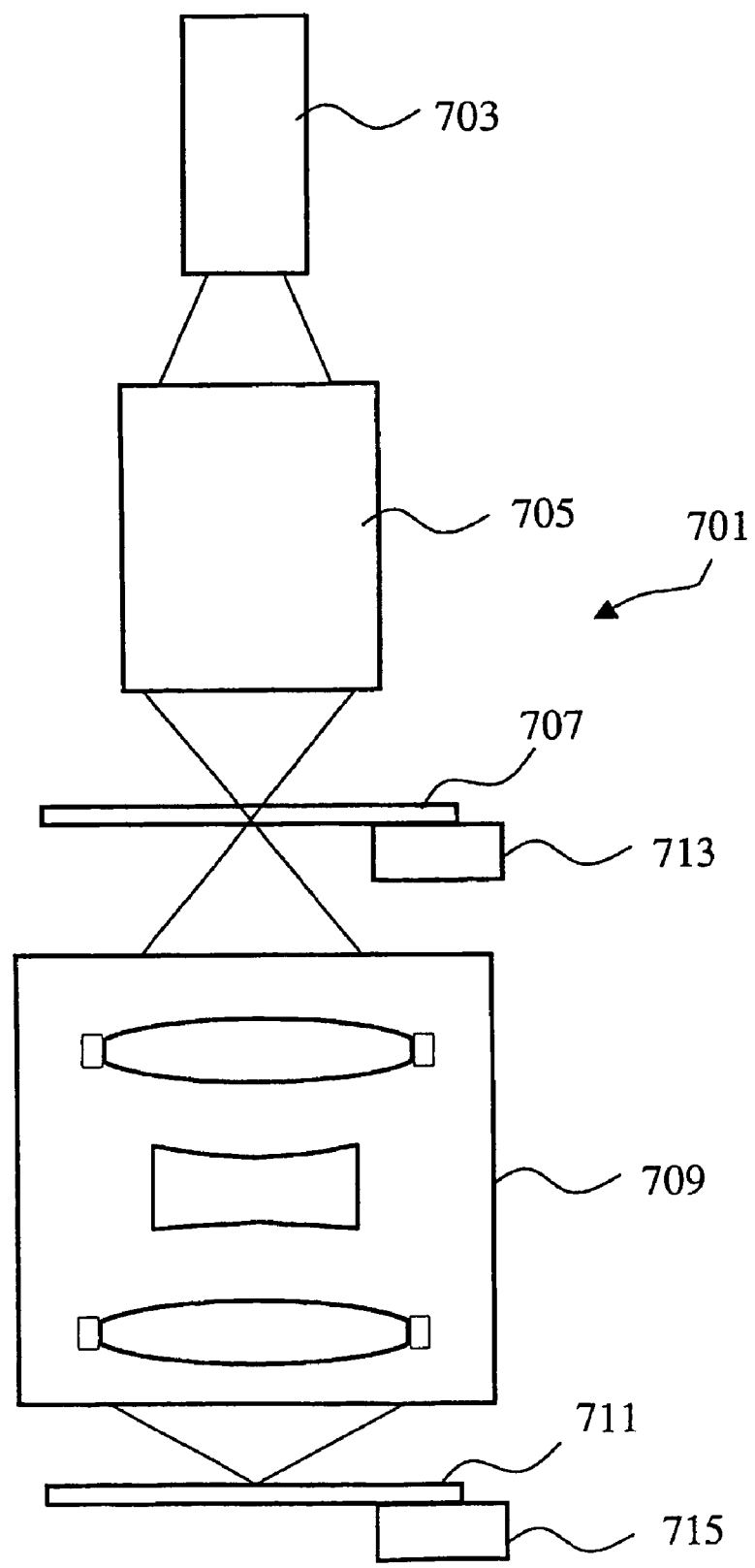

FIGS. 3A–E illustrate the birefringence distribution for (100)-lenses in different representations as well as the effective birefringence distribution for a homogeneous group of (100)-lenses;

FIGS. 4A–E illustrate the birefringence distribution for (111)-lenses in different representations as well as the effective birefringence distribution for a homogeneous group of (111)-lenses;

FIGS. 5A–E illustrate the birefringence distribution for (110)-lenses in different representations as well as the effective birefringence distribution for a homogeneous group of (110)-lenses;

FIG. 6 illustrates a sectional view through the lenses of a refractive projection objective according to a second embodiment of the invention; and FIG. 7 illustrates a microlithography projection apparatus in a schematic representation.

Figure 1:
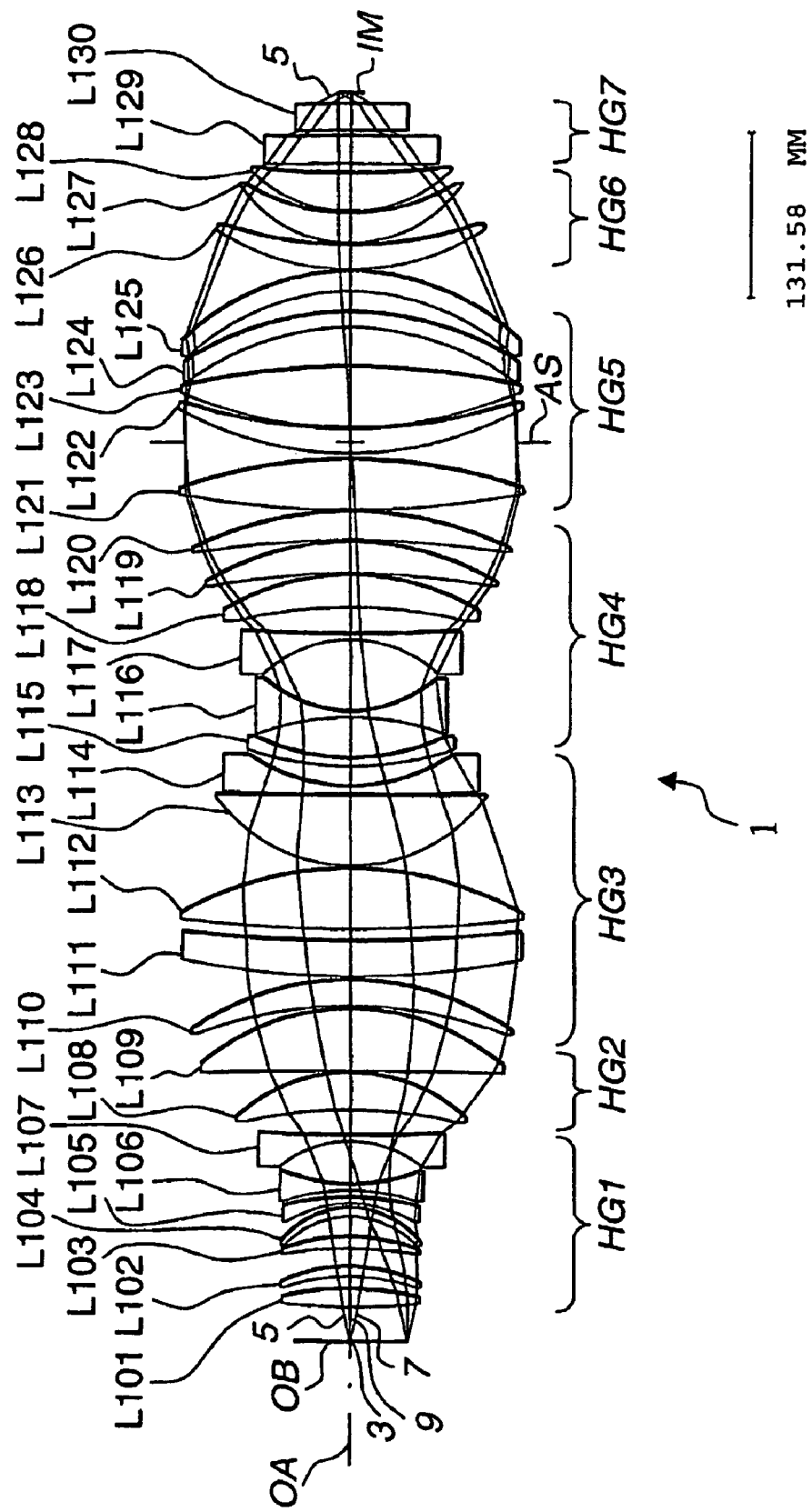
FIG. 1 illustrates a sectional view through the lenses of a refractive projection objective according to a first embodiment of the invention.

A first embodiment of an objective 1 with birefringent lenses is shown in FIG. 1 in a sectional view through the lenses. The objective 1 is a refractive projection objective for a microlithography projection apparatus for a working wavelength of 157 nm. The optical data for this objective are listed in Table 1. The illustrated example has been taken from another patent application filed by the same applicant, WO 01/50171 (U.S. Ser. No. 10/177,580), where the same example is represented in FIG. 7 and Table 6. For a detailed description of the design and function of the objective 1, the reader is hereby referred to WO 01/50171 (U.S. Ser. No. 10/177,580). All lenses of this objective consist of crystalline calcium fluoride. The numerical aperture on the image side of the objective is 0.9. The imaging properties of this objective are corrected to such an extent that the deviation from the wave front of an ideal spherical wave is less than 1.8 mλ for a wavelength of 157 nm, if one considers only those aberrations that are caused by the lens geometry. Especially in objectives with this high level of performance, it is necessary that adverse factors such as the influence of intrinsic birefringence be reduced as much as possible.

A bundle of rays that is delimited by outermost aperture rays originates from an object point 3 in the object plane OB. The sectional view of FIG. 1 shows the outer aperture rays 5 and 7, which are in this case outermost aperture rays. In the diaphragm plane AS, the outer aperture rays 5 and 7 run at a height (perpendicular distance) from the optical axis OA that is equal to one-half of the diaphragm diameter. In the image plane IM, the aperture angle of the outer aperture rays 5 and 7 equals arcsin(NA)=64.2°, where NA is the numerical aperture of the objective 1 in the image plane IM. Since the object point 3 lies on the optical axis OA, the principal ray 9 runs along the optical axis OA.

Figure 2:
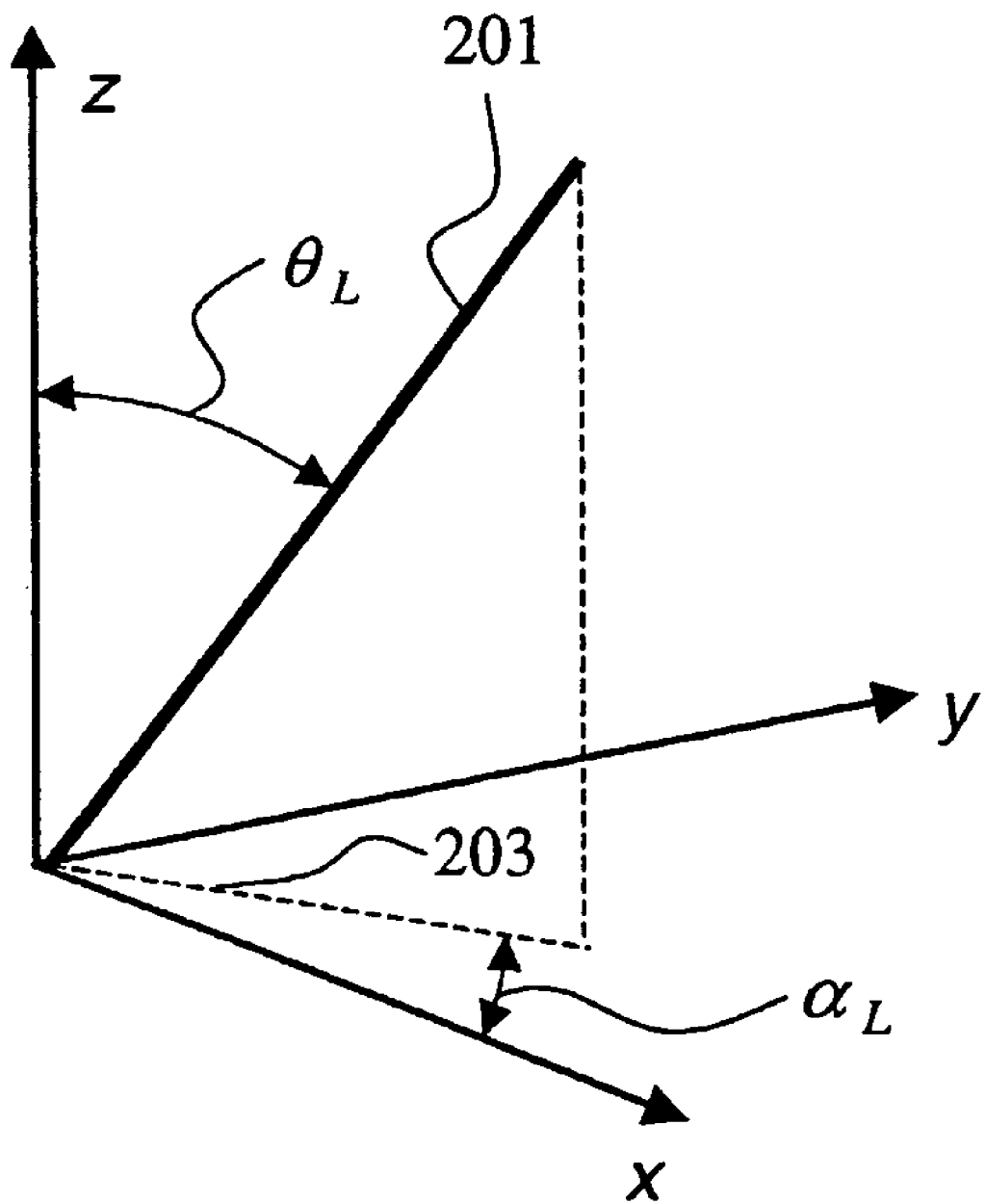
FIG. 2 represents a coordinate system used to define the aperture angle and the azimuth angle.

FIG. 2 serves to illustrate the definition of the aperture angle $\theta_L$ and the azimuth angle $\alpha_L$ of a light ray in a lens. The local x-y-z coordinate system of a lens is shown as a frame of reference with the z-axis pointing in the direction of the lens axis. The ray 201 has an aperture angle $\theta_L$ relative to the lens axis. The azimuth angle $\alpha_L$ of the ray 201 is obtained by projecting the light ray direction into a plane whose normal vector points in the direction of the lens axis and by measuring the angle from the x-axis to the projection 203 of the light ray 201. The local x-axis in the illustrated embodiments runs in the same direction as the projection of the (110)-direction into the same plane for lenses whose lens axes are oriented in the (100)-direction or in the (111)-direction of the crystallographic structure. The important issue in defining the local coordinate system is that the local x-axis has a defined relationship to the crystallographic orientation of the lens, and that this defined relationship is the same for all lenses of equivalent crystallographic structure.

Because of the intrinsic birefringence of calcium fluoride, the outer aperture ray 5 in FIG. 1 is subject to an optical path difference for two mutually orthogonal states of polarization in each of the lenses L101 to L130, where the optical path difference in each lens depends on the azimuth angle $\alpha_L$ and the aperture angle $\theta_L$. As the principal ray 9 runs along the optical axis and is therefore not subject to an optical path difference between two mutually orthogonal states of polarization, the aperture-/principal-ray retardation is equal to the optical path difference of the outer aperture ray 5.

Figure 3A:
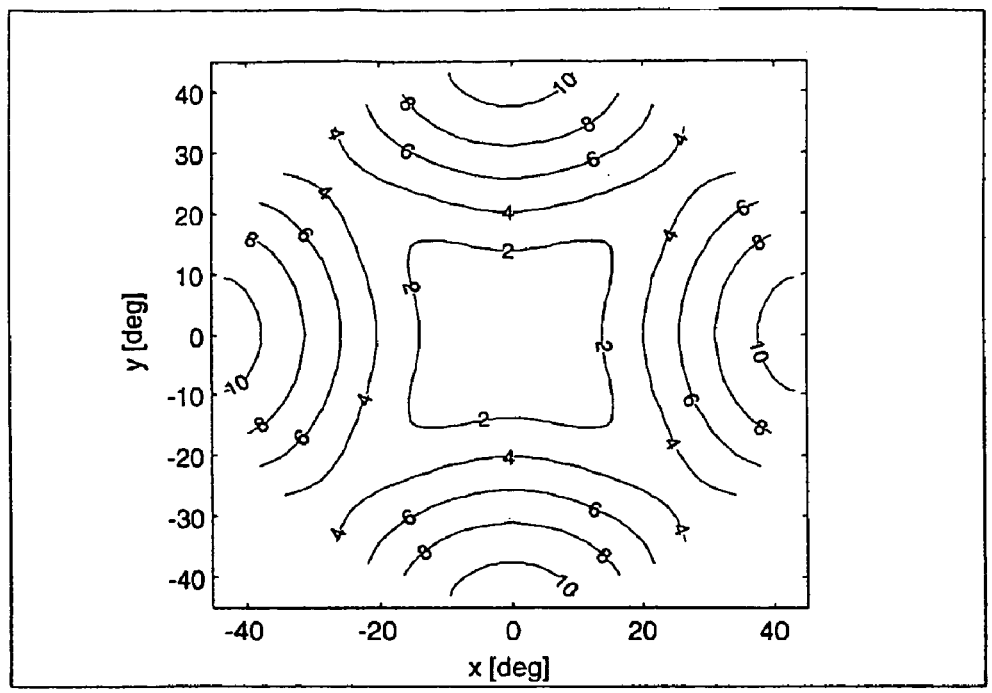
Figure 3B:
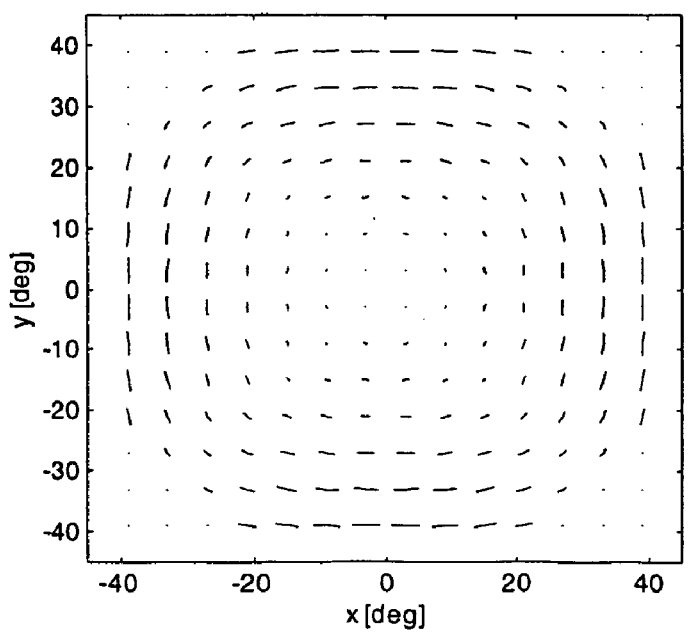

FIGS. 3A and 3B illustrate the birefringence distribution function $\Delta n\ (\alpha_L,\theta_L)$ for (100)-lenses of calcium fluoride.

The contour curves in FIG. 3A indicate the amount of the intrinsic birefringence in nm/cm as a function of the aperture angle $\theta_L$ and the azimuth angle $\alpha_L$. The angles are obtained from the equations $\sin(\theta^{L2})=x^2+y^2$ and $\alpha_L$=arctan (x/y).

Each of the short lines in FIG. 3B represents the magnitude and direction of the birefringence effect for a light ray direction defined by the aperture angle $\theta_L$ and the azimuth angle $\alpha_L$. The length of each line is in proportion to the magnitude of the birefringence effect or, more specifically, to the length difference between the principal axes of the intersectional ellipse, while the direction of each line indicates the orientation of the longer principal axis of the intersectional ellipse. The intersectional ellipse is obtained as the intersection between the index ellipsoid for a light ray in the direction $(\alpha_L,\theta_L)$ and a plane that extends perpendicular to the direction of the light ray and cuts through the center of the index ellipsoid.

The fourfold azimuthal symmetry of the birefringence distribution of (100)-lenses is made evident by FIG. 3A and FIG. 3B. The maximum amounts of intrinsic birefringence occur at azimuth angles of 0°, 90°, 180°, and 270°.

If (100)-lenses that are combined in a homogeneous group are rotated relative to each other, it is possible to achieve a condition in a light ray passing through the lenses so that the optical path difference for two mutually orthogonal states of polarization is almost exclusively dependent on the aperture angle $\theta_L$ while being nearly independent of the azimuth angle $\alpha_L$. With good approximation, the effective birefringence distribution of these lenses can be described by a function that depends only on the aperture angle $\theta_L$. This approximation turns into an exact characterization in the case where the (100)-lenses are planar-parallel plates. In actual lenses, the approximation can be achieved at least for certain aperture angles $\theta_L$.

Figure 3C:
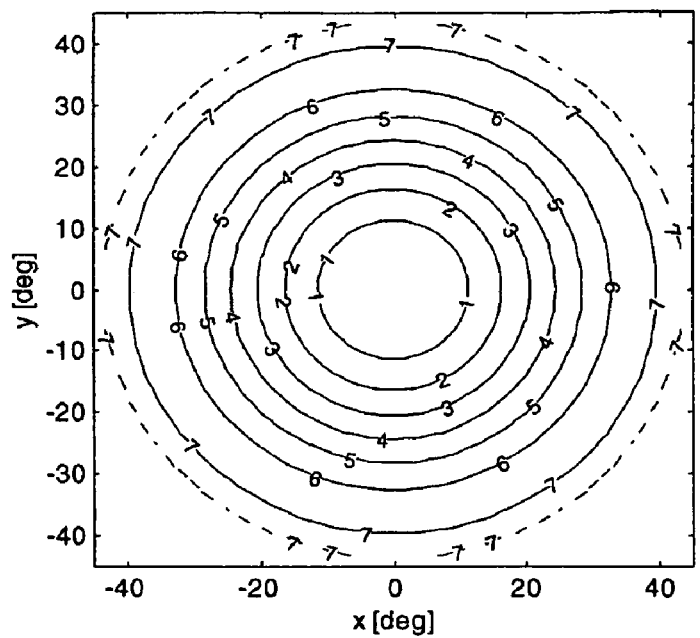
Figure 3D:
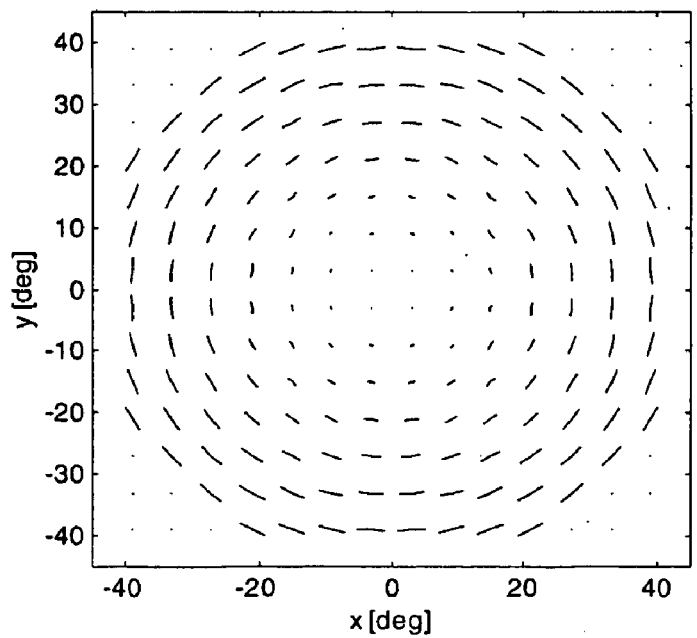

FIGS. 3C and 3D illustrate the magnitude and direction of the effective birefringence occurring in a homogeneous group of (100)-lenses for different light ray directions.

Figure 3E:
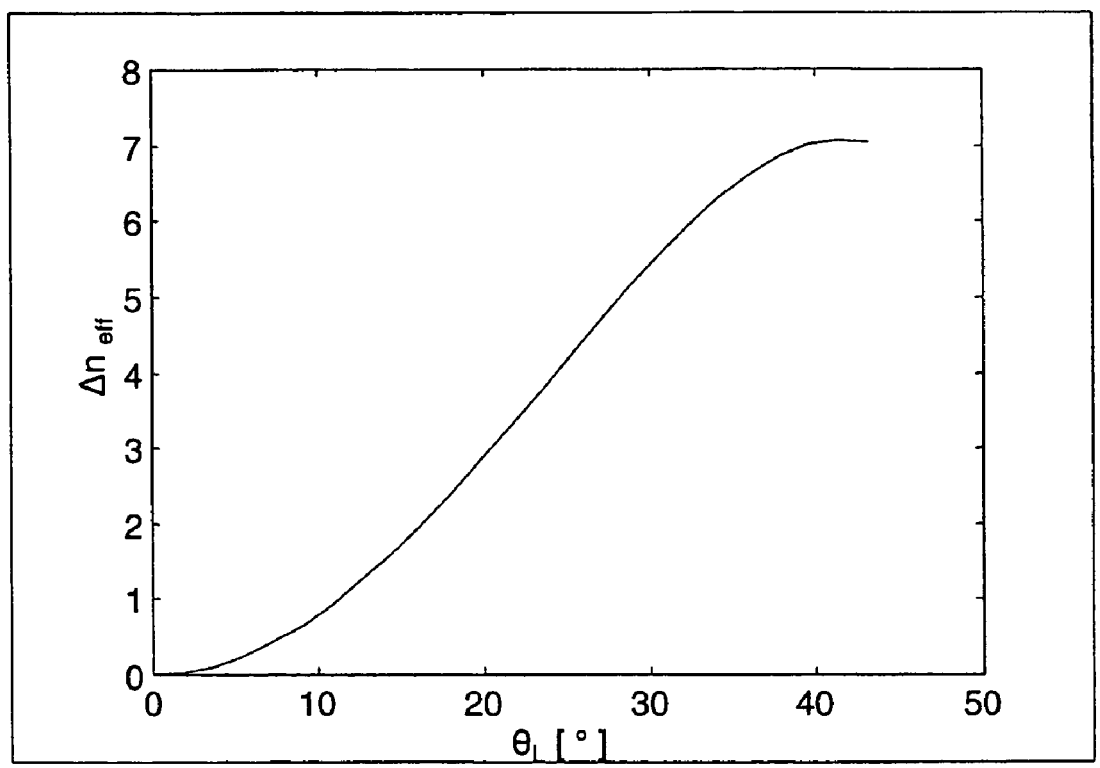

FIG. 3E shows a radial profile of the effective birefringence distribution. The graph can be mathematically described by the function $$\Delta n_{\mathit{eff}}(\theta_L) = MA_L \cdot DI_L \cdot \frac{7}{9} \cdot \sin^2\theta_L \cdot (7 \cdot \cos^2\theta_L - 1), \quad (4)$$

wherein the material parameter $MA_L$ equals 2,4 nm/cm for calcium fluoride and a wavelength of 157 nm and the orientation parameter $DI_L$ equals −3.

For aperture angles of $\theta_L < 40°$, equation (4) may be replaced by the approximation $$\Delta n_{\mathit{eff}}(\theta_L) \, MA_L \cdot DI_L \cdot \sin^2(2{,}17 \cdot \theta_L). \quad (5)$$

Figure 4A:
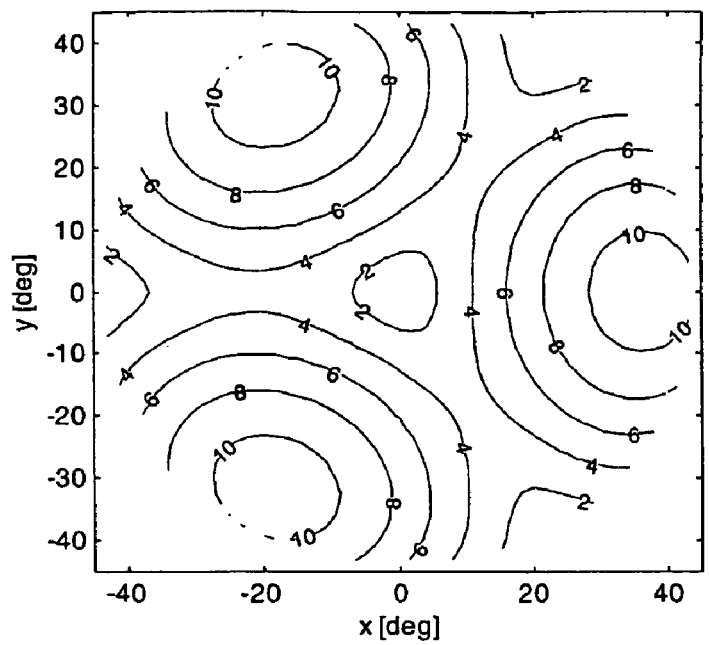
Figure 4B:
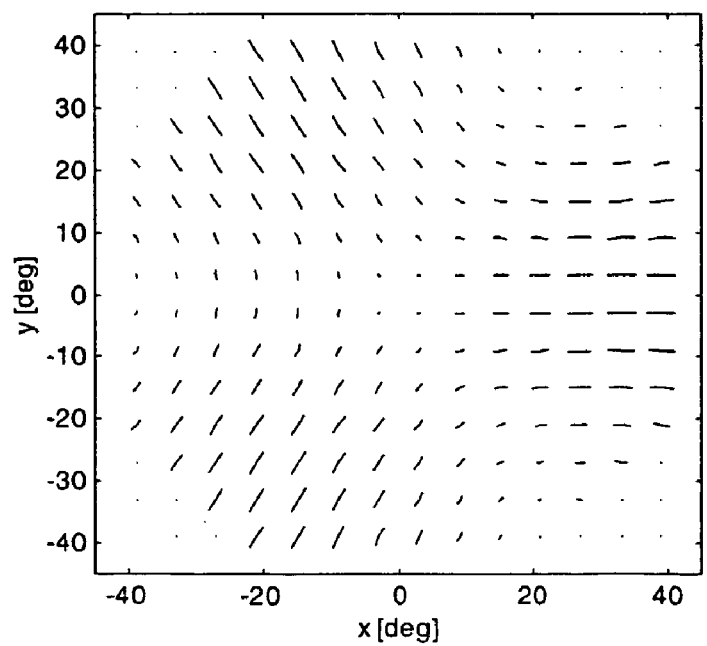

FIGS. 4A and 4B illustrate the birefringence distribution function $\Delta n(\alpha_L, \theta_L)$ for (111)-lenses of calcium fluoride. The format of the graphical representation is the same as in FIGS. 3A and 3B. The threefold symmetry of the birefringence distribution of (111)-lenses is evident from the graphs. The maximum amounts of intrinsic birefringence occur at the azimuth angles of 0°, 120°, and 240°.

Figure 4C:
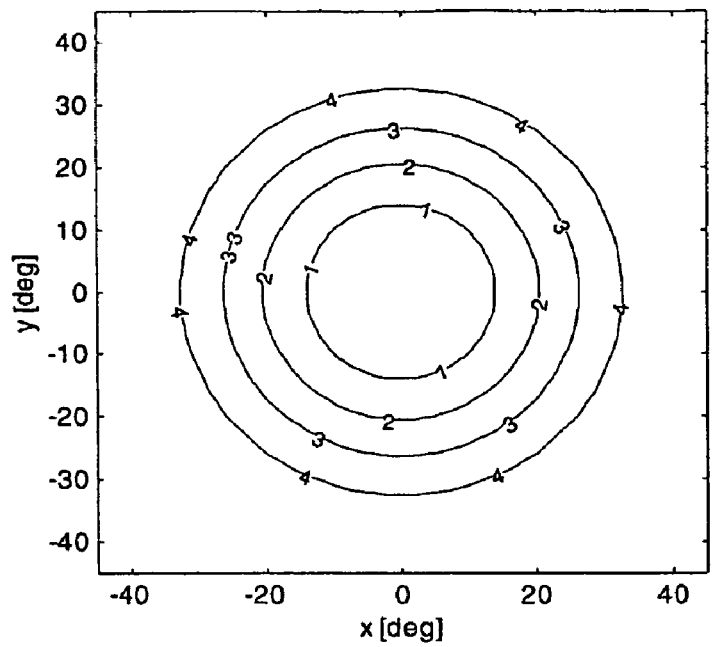
Figure 4D:
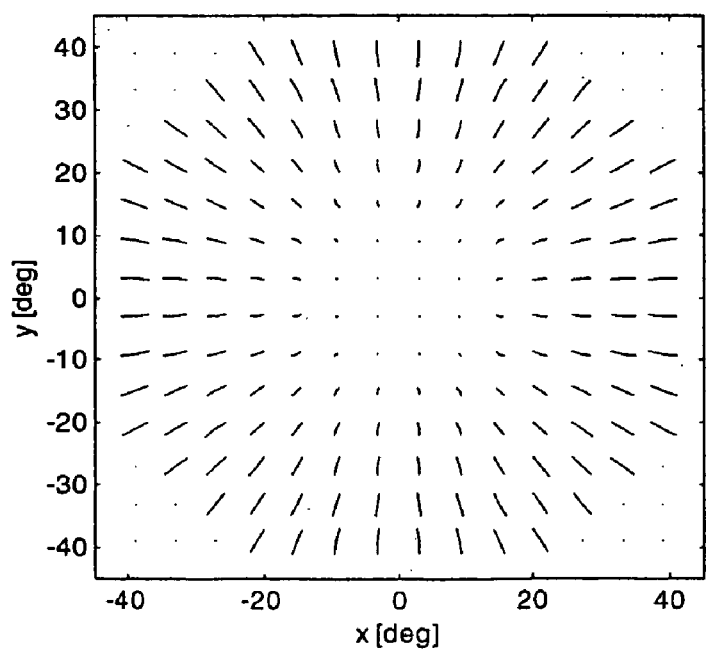

If (111)-lenses are rotated relative to each other about the lens axes, it is likewise possible to come close to an effective birefringence distribution that depends only on the aperture angle $\theta_L$, so that it can be described by a function $\Delta n(\theta_L)$ FIGS. 4C and 4D illustrate the magnitude and direction of the effective birefringence occurring in a homogeneous group of (111)-lenses for different light ray directions.

Figure 4E:
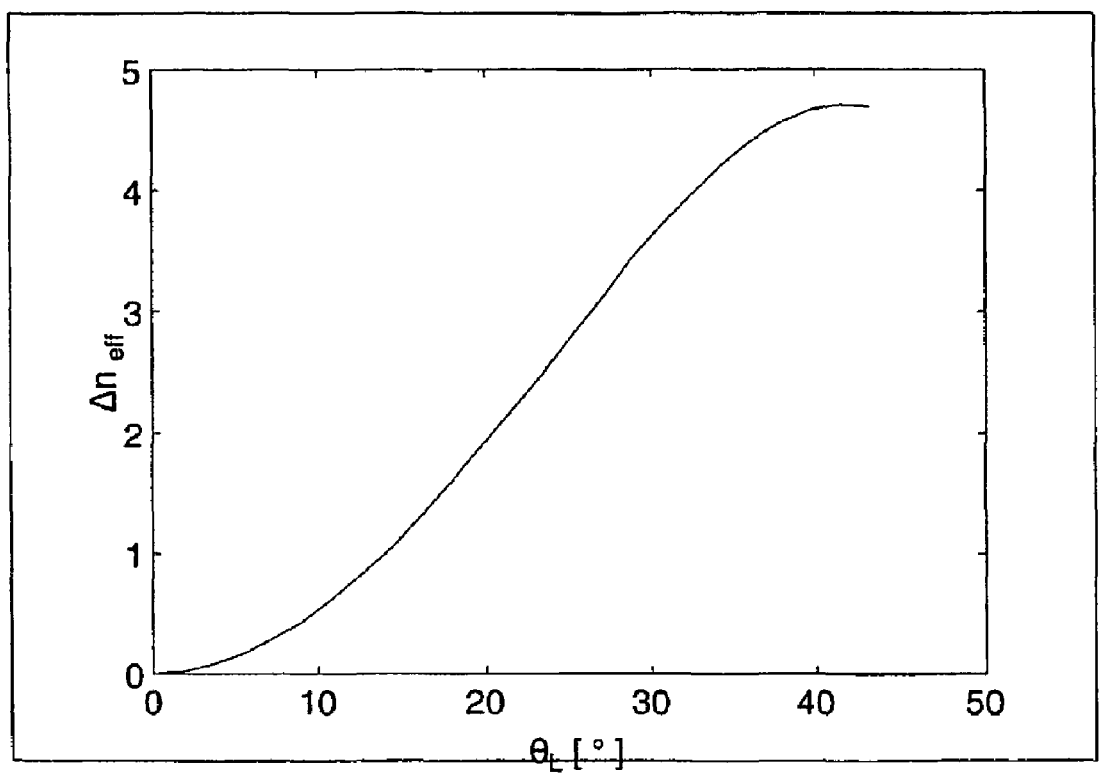

FIG. 4E shows a radial profile of the effective birefringence distribution. The graph of FIG. 4E can likewise be represented by the equations (4) and (5), wherein the material parameter $MA_L$ equals 2,4 nm/cm for calcium fluoride and a wavelength of 157 nm and the orientation parameter $DI_L$ equals +2.

Figure 5A:
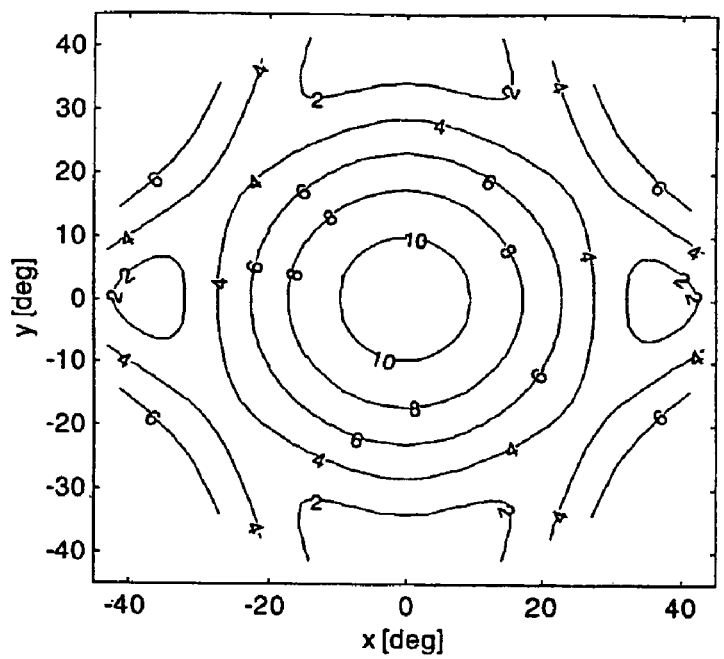
Figure 5B:
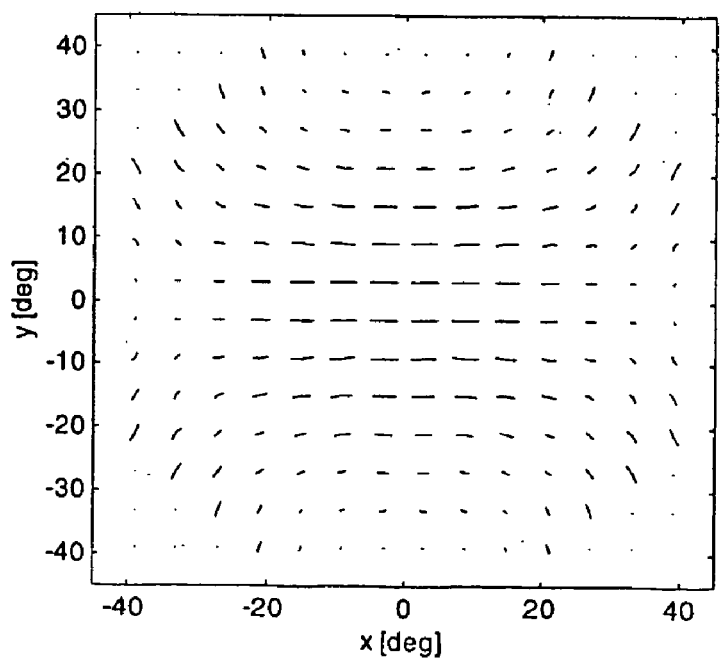

FIGS. 5A and 5B illustrate the birefringence distribution function $\Delta n(\alpha_L, \theta_L)$ for (110)-lenses of calcium fluoride. The format of the graphical representation is the same as in FIGS. 3A and 3B. The twofold symmetry of the birefringence distribution of (110)-lenses is evident from the graphs. The maximum amounts of intrinsic birefringence occur at the azimuth angles of 0° and 180°.

If (110)-lenses are rotated relative to each other about the lens axes, it is likewise possible to come close to an effective birefringence distribution that depends only on the aperture angle $\theta_L$, so that it can be described by a function $\Delta n(\theta_L)$.

However, an ideal solution in this case requires at least four appropriate (110)-lenses. But even with only two appropriate (110)-lenses that are rotated relative to each other, it is possible to achieve an effective birefringence distribution that shows a dependency on the azimuth angle $\alpha_L$ only at larger aperture angles $\theta_L$.

Figure 5C:
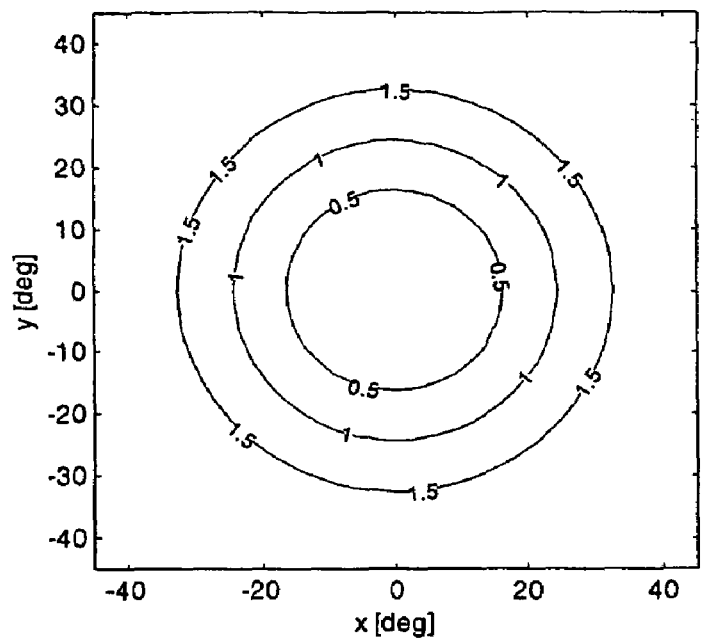
Figure 5D:
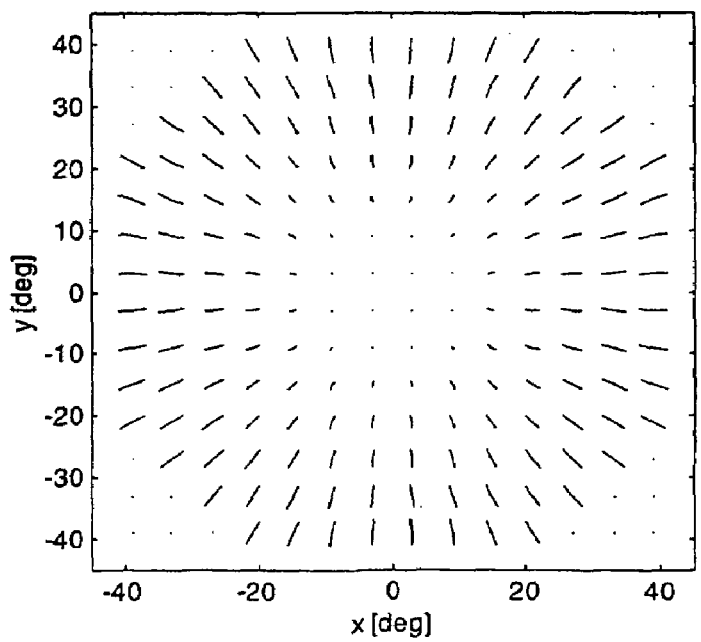

FIGS. 5C and 5D illustrate the magnitude and direction of the effective birefringence occurring in a homogeneous group of (110)-lenses for different light ray directions.

Figure 5E:
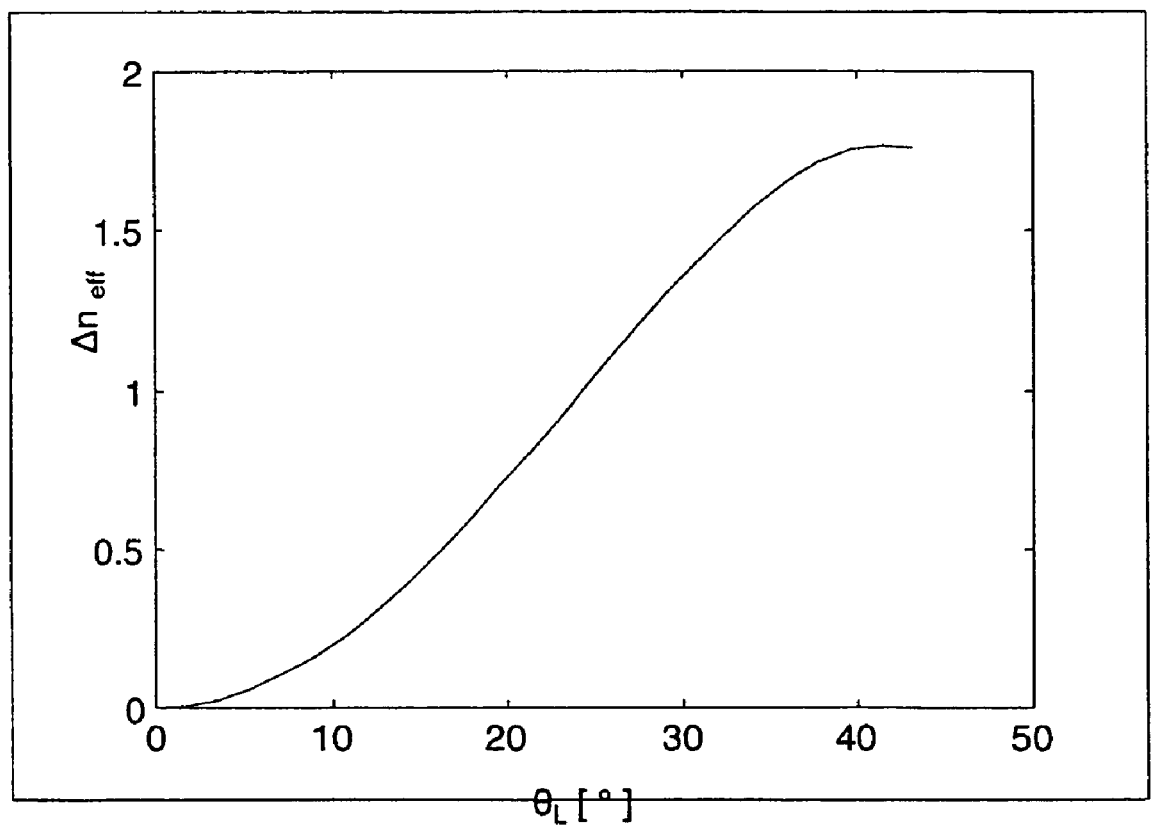

FIG. 5E shows a radial profile of the effective birefringence distribution. The graph of FIG. 5E can likewise be represented by the equations (4) and (5), wherein the material parameter $MA_L$ equals 2,4 nm/cm for calcium fluoride and a wavelength of 157 nm and the orientation parameter $DI_L$ equals ¾=0.75.

In the first embodiment according to FIG. 1, the undesirable influence of the intrinsic birefringence was reduced in a system with calcium fluoride lenses whose lens axes are oriented either in the (100)- or (111)-direction of the crystallographic structure. The lens axes of the lenses L101 to L107 and of the lenses L110 to L128, which are also referred to as second lenses, are oriented in the (111)-direction, while the lens axes of the lenses L108, L109, L129 and L130, which are also referred to as first lenses, are oriented in the (100)-direction of the crystallographic structure.

Depending on their azimuth angle, the outermost aperture rays in the illustrated objective 1 are subject to an aperture-/principal-ray retardation between −1.7 nm and 2.9 nm, which translates into −0.01λ and 0.02λ, respectively, at the working wavelength of 157 nm. The aperture-/principal-ray retardation was calculated on the basis of the actual birefringence distributions of the lenses and their orientations in the installed state, but without taking the influence of the anti-reflex coatings into account. The anti-reflex coatings have a deteriorating effect of approximately 0.002λ for each coated surface, somewhat dependent on the nature of the coating.

Table 2 contains the essential characteristics for the objective 1 according to the invention. The column headings from left to right are abbreviations for the following:

volume of the enveloping cylinder $VZ_L$ in [cm³], aperture angle $\theta_L$ in [°], optical path length $OP_L$ in [mm], characteristic quantity of a light ray $CN_L$ in [mm], light ray parameter $SP_L$ in [mm], orientation parameter $DI_L$, compensation parameter $KP_L$ in [mm]

material parameter $MA_L$ in [nm/cm], birefringence parameter $BF_L$ in [nm], angle of rotation $\gamma_L$ [0], and azimuth angle $\alpha_L$ of the outer aperture ray 5 in a lens in [°].

The reference direction of a lens is parallel to a direction that is defined by the projection of the (110)-direction into a plane whose normal vector points in the (100)- or (111)-direction of the crystallographic structure, depending on which direction the lens axis is oriented in. The angle of rotation $\gamma_L$ measures the angle from a reference direction of the objective to the reference direction of the fluoride crystal lens that has been rotated about the lens axis. The reference direction of the objective points, e.g., in the direction of the y-axis if the optical axis of the objective coincides with the z-axis.

TABLE 2

| Lens | $VZ_L[cm^3]$ | $\theta_L[°]$ | $OP_L[mm]$ | $CN_L[mm]$ | $SP_L[mm]$ | $DI_L$ | $KP_L[mm]$ | $MA_L[nm/cm]$ | $BF_L[nm]$ | $Y_L[°]$ | $\alpha_L[°]$ |
|---|---|---|---|---|---|---|---|---|---|---|---|
| L101 | 138 | 8.1 | 15.1 | 0.30 | 1.38 | 2 | 2.75 | 2.4 | 0.66 | 60 | 60 |
| L102 | 161 | 8.7 | 8.2 | 0.19 | 0.86 | 2 | 1.72 | 2.4 | 0.41 | 60 | 60 |
| L103 | 129 | 7.8 | 9.5 | 0.17 | 0.81 | 2 | 1.61 | 2.4 | 0.39 | 60 | 60 |
| L104 | 286 | 10.7 | 7.2 | 0.25 | 1.12 | 2 | 2.24 | 2.4 | 0.54 | 60 | 60 |
| L105 | 199 | 9.4 | 6.5 | 0.17 | 0.79 | 2 | 1.58 | 2.4 | 0.38 | 60 | 60 |
| L106 | 241 | 10.3 | 8.5 | 0.27 | 1.23 | 2 | 2.46 | 2.4 | 0.59 | 60 | 60 |
| L107 | 436 | 21.8 | 12.7 | 1.75 | 6.86 | 2 | 13.72 | 2.4 | 3.29 | 0 | 0 |
| L108 | 1026 | 25.4 | 22.2 | 4.08 | 14.94 | −3 | −44.82 | 2.4 | −10.76 | 0 | 0 |
| L109 | 2316 | 16.3 | 36.1 | 2.84 | 12.10 | −3 | −36.29 | 2.4 | −8.71 | 45 | 45 |
| L110 | 2193 | 12.2 | 15.2 | 0.68 | 3.02 | 2 | 6.04 | 2.4 | 1.45 | 0 | 0 |
| L111 | 2042 | 2.3 | 26.6 | 0.04 | 0.20 | 2 | 0.40 | 2.4 | 0.10 | 0 | 0 |
| L112 | 2829 | 2.3 | 32.2 | 0.05 | 0.24 | 2 | 0.49 | 2.4 | 0.12 | 0 | 0 |
| L113 | 2045 | 18.3 | 30.4 | 3.00 | 12.41 | 2 | 24.82 | 2.4 | 5.96 | 0 | 60 |
| L114 | 1033 | 18.7 | 22 | 2.26 | 9.31 | 2 | 18.62 | 2.4 | 4.47 | 60 | 0 |
| L115 | 492 | 14 | 10.2 | 0.60 | 2.61 | 2 | 5.22 | 2.4 | 1.25 | 0 | 60 |
| L116 | 826 | 1.3 | 29.8 | 0.02 | 0.07 | 2 | 0.14 | 2.4 | 0.03 | 0 | 60 |
| L117 | 822 | 26.4 | 31.6 | 6.25 | 22.37 | 2 | 44.74 | 2.4 | 10.74 | 0 | 0 |
| L118 | 1196 | 33.5 | 14.3 | 4.36 | 13.03 | 2 | 26.07 | 2.4 | 6.26 | 60 | 60 |
| L119 | 1498 | 26.5 | 7.5 | 1.49 | 5.34 | 2 | 10.67 | 2.4 | 2.56 | 60 | 60 |
| L120 | 1660 | 19.3 | 6.4 | 0.70 | 2.85 | 2 | 5.70 | 2.4 | 1.37 | 60 | 60 |
| L121 | 2394 | 6.7 | 8 | 0.11 | 0.50 | 2 | 1.01 | 2.4 | 0.24 | 60 | 60 |
| L122 | 2374 | 10.3 | 7.7 | 0.25 | 1.11 | 2 | 2.23 | 2.4 | 0.53 | 0 | 60 |
| L123 | 2765 | 11.9 | 9.6 | 0.41 | 1.82 | 2 | 3.64 | 2.4 | 0.87 | 60 | 0 |
| L124 | 3065 | 0.3 | 17.8 | 0.00 | 0.00 | 2 | 0.00 | 2.4 | 0.00 | 0 | 0 |
| L125 | 3838 | 6 | 16.3 | 0.18 | 0.83 | 2 | 1.65 | 2.4 | 0.40 | 0 | 0 |
| L126 | 1251 | 24 | 9 | 1.49 | 5.60 | 2 | 11.20 | 2.4 | 2.69 | 60 | 0 |
| L127 | 1162 | 35.6 | 8 | 2.71 | 7.61 | 2 | 15.22 | 2.4 | 3.65 | 60 | 0 |
| L128 | 665 | 39.4 | 12 | 4.83 | 11.93 | 2 | 23.85 | 2.4 | 5.72 | 0 | 60 |
| L129 | 330 | 35.3 | 27.3 | 9.12 | 25.83 | −3 | −77.50 | 2.4 | −18.60 | 45 | 45 |
| L130 | 130 | 35.3 | 26 | 8.68 | 24.60 | −3 | −73.81 | 2.4 | −17.71 | 0 | 0 |
| Sum | | | | | | | −4.6 | | −1.1 | | |

The combined material volume of the lenses L108, L109, L129 and L130, whose lens axes are oriented in the (100)-direction of the crystallographic structure, amounts to 3803 cm$^3$, while the total material volume of all lenses is 39545 cm$^3$. Thus, the ratio of the combined volume of the (100)-lenses to the total value of all lenses is 9.6%.

The small material volume for the (100)-lenses was achieved by selecting for the (100)-lenses as much as possible those in which the outer aperture ray 5 has a large aperture angle $\theta_L$. The maximum of all aperture angles, $\theta_L=39.4°$, occurs in the (111)-lens L128. The lenses L108, L109, L129 and L130 have aperture angles $\theta_L$ of, respectively, 25.4°, 16.3°, 35.3°, and 35.3°, so that at least the lenses L129 and L130 have aperture angles $\theta_L$ that are larger than 70% of the maximum aperture angle $\theta_L=39.4°$.

The characteristic light ray quantity $CN_L$ is largest for the lens L129, i.e., 9.1 mm. The characteristic light ray quantity $CN_L$ for the lenses L129 as well as L130 is larger than 90% of 9.1 mm, which would be 8.2 mm.

In all of the (111)-lenses, i.e., L101 to L107 and L110 to L128, the characteristic light ray quantities $CN_L$ are smaller than 75% of 9.1 mm, which would be 6.8 mm.

With a difference of only 2%, the absolute amount of the sum of the birefringence factors $BF_L$ of the (100)-lenses, i.e., 55.8 nm, is virtually equal to the absolute amount of the sum of the birefringence factors $BF_L$ of the (111)-lenses, i.e., 54.7 nm.

The lenses of the objective 1 are assigned to the five homogeneous groups HG1, HG3, HG4, HG5 and HG6 with (111)-lenses, and to the two homogeneous groups HG2 and HG7 with (100)-lenses.

The lenses within each homogeneous group 1 are, in turn, assigned to two subgroups UG1 and UG2. Equivalent crystallographic directions within a subgroup are oriented in the same direction if the angle of rotation γ between the lenses is 0°. The angle of rotation between two (100)-lenses of different subgroups is 45°, and the angle of rotation between two (111)-lenses of different subgroups is 60°.

The assignment of the lenses to the homogeneous groups and subgroups is shown in Table 3.

TABLE 3

| Homogeneous Group | Subgroup | Lenses | Sum Σ($KP_L$) | Sum Σ($BF_L$) |
|---|---|---|---|---|
| HG1 | UG1 | L107 | 13.72 | 3.29 |
|  | UG2 | L101–L106 | 12.36 | 2.97 |
| HG2 | UG1 | L108 | −44.82 | −10.76 |
|  | UG2 | L109 | −36.29 | −8.71 |
| HG3 | UG1 | L110–L112, L114 | 25.55 | 6.13 |
|  | UG2 | L113 | 24.82 | 5.96 |
| HG4 | UG1 | L117 | 44.74 | 10.74 |
|  | UG2 | L115, L116, L118–L120 | 47.81 | 11.47 |

TABLE 3-continued

| Homogeneous Group | Subgroup | Lenses | Sum Σ(KP$_L$) | Sum Σ(BF$_L$) |
|---|---|---|---|---|
| HG5 | UG1 | L123–L125 | 5.30 | 1.27 |
|  | UG2 | L121, L122 | 3.24 | 0.78 |
| HG6 | UG1 | L126, L127 | 26.42 | 6.34 |
|  | UG2 | L128 | 23.85 | 5.72 |
| HG7 | UG1 | L130 | −73.81 | −17.71 |
|  | UG2 | L129 | −77.50 | −18.60 |

The condition $075 \cdot \Sigma_{HG}(BF_L) < 2 \cdot \Sigma_{UG}(BF_L) < 1,25 \cdot \Sigma_{HG}(BF_L)$ is met in each of the subgroups.

In the objective 1, the (100)-lenses L129 and L130, which form the homogeneous group HG7, are the last two lenses in the light path before the image plane IM.

The angle of rotation between any two lenses from different homogeneous groups has almost no influence on the compensation of the birefringence effects. This quantity remains available as a degree of freedom for the optimization of image errors that are not rotationally symmetric and can be caused by the manufacturing process or by technical factors in the lens mounts.

It is also possible to have an arrangement with only one homogeneous group HGB of (100)-lenses and one homogeneous group HG9 of (111)-lenses, each of which is subdivided into two subgroups.

The assignment of the lenses to the homogeneous groups and subgroups is shown in Table 4.

TABLE 4

| Homogeneous Group | Subgroup | Lenses | Sum Σ(KP$_L$) [mm] | Sum Σ(BF$_L$) [nm] |
|---|---|---|---|---|
| HG8 | UG1 | L108, L130 | −118.6 | −28.5 |
|  | UG2 | L109, L129 | −113.8 | −27.3 |
| HG9 | UG1 | L107, L110–L112, L114, L123–L127 | 115.7 | 27.8 |
|  | UG2 | L101–L106, L113, L115, L116, L118–L122, L128 | 112.1 | 26.9 |

The condition $075 \cdot \Sigma_{HG}(BF_L) < 2 \cdot \Sigma_{UG}(BF_L) < 1,25 \cdot \Sigma_{HG}(BF_L)$ is met in each of the subgroups.

A second embodiment of an objective 601 with birefringent lenses is shown in FIG. 6 in a sectional view through the lenses. The objective 601 is a refractive projection objective for a microlithography projection apparatus for a working wavelength of 157 nm. The optical data for this objective 601 are listed in Table 5. The numerical aperture on the image side of the objective is 0.9.

A bundle of rays that is delimited by outermost aperture rays originates from an object point 603 in the object plane OB. The sectional view of FIG. 6 shows the outer aperture rays 605 and 607, which are in this case outermost aperture rays. In the diaphragm plane AS, the outer aperture rays 605 and 607 run at a height (perpendicular distance) from the optical axis OA that is equal to one-half of the diaphragm diameter. In the image plane IM, the aperture angle of the outer aperture rays 605 and 607 equals arcsin(NA)=64.2°, where NA is the numerical aperture of the objective 601 in the image plane IM. Since the object point 603 lies on the optical axis OA, the principal ray 609 runs along the optical axis OA.

In the objective 601, the detrimental influence of intrinsic birefringence was reduced by using a combination of calcium fluoride lenses and barium fluoride lenses. The lens axes of all lenses are oriented in the (111)-direction. On its passage through the lenses L601 to L630, the principal ray 609 is therefore not subject to an optical path difference for two mutually orthogonal states of polarization.

Depending on their azimuth angle, the outermost aperture rays in the illustrated objective 601 are subject to an aperture-/principal-ray retardation between 1.0 nm and 14.0 nm, which translates into 0.006λ and 0.09λ, respectively, at the working wavelength of 157 nm. The aperture-/principal-ray retardation was calculated on the basis of the actual birefringence distributions of the lenses and their orientations in the installed state.

The essential characteristics of the objective 601 according to the invention are listed in Table 6.

TABLE 6

| Lens | VZ$_L$[cm$^3$] | θ$_L$[°] | OP$_L$[mm] | CN$_L$[mm] | SP$_L$[mm] | DI$_L$ | KP$_L$[mm] | MA$_L$[nm/cm] | BF$_L$[nm] | Y$_L$[°] | α$_L$[°] |
|---|---|---|---|---|---|---|---|---|---|---|---|
| L601 | 126 | 8.15 | 15.12 | 0.30 | 1.39 | 2 | 2.79 | 2.4 | 0.67 | 60 | 60 |
| L602 | 158 | 8.69 | 8.20 | 0.19 | 0.86 | 2 | 1.71 | 2.4 | 0.41 | 60 | 60 |
| L603 | 133 | 7.76 | 9.50 | 0.17 | 0.80 | 2 | 1.59 | 2.4 | 0.38 | 60 | 60 |
| L604 | 285 | 10.75 | 7.23 | 0.25 | 1.13 | 2 | 2.26 | 2.4 | 0.54 | 60 | 60 |
| L605 | 205 | 9.42 | 6.49 | 0.17 | 0.79 | 2 | 1.58 | 2.4 | 0.38 | 60 | 60 |
| L606 | 272 | 10.34 | 8.47 | 0.27 | 1.23 | 2 | 2.47 | 2.4 | 0.59 | 60 | 60 |
| L607 | 450 | 21.78 | 12.75 | 1.75 | 6.88 | 2 | 13.75 | 2.4 | 3.30 | 0 | 0 |
| L608 | 1048 | 25.46 | 22.21 | 4.10 | 14.99 | 2 | 29.99 | 2.4 | 7.20 | 0 | 0 |
| L609 | 2394 | 16.29 | 36.07 | 2.84 | 12.07 | 2 | 24.15 | 2.4 | 5.80 | 60 | 60 |
| L610 | 2254 | 12.25 | 15.24 | 0.69 | 3.05 | 2 | 6.11 | 2.4 | 1.47 | 0 | 0 |
| L611 | 1299 | 2.32 | 26.65 | 0.04 | 0.21 | 2 | 0.41 | 2.4 | 0.10 | 0 | 0 |
| L612 | 2431 | 2.26 | 32.17 | 0.05 | 0.24 | 2 | 0.47 | 2.4 | 0.11 | 0 | 0 |
| L613 | 2076 | 18.33 | 30.41 | 3.01 | 12.45 | 2 | 24.90 | 2.4 | 5.98 | 0 | 60 |
| L614 | 1034 | 18.71 | 22.05 | 2.27 | 9.34 | 2 | 18.68 | 2.4 | 4.48 | 60 | 0 |
| L615 | 466 | 14.03 | 10.22 | 0.60 | 2.62 | 2 | 5.25 | 2.4 | 1.26 | 0 | 60 |
| L616 | 816 | 1.32 | 29.87 | 0.02 | 0.07 | 2 | 0.15 | 2.4 | 0.04 | 0 | 60 |
| L617 | 869 | 26.37 | 31.65 | 6.24 | 22.37 | 2 | 44.75 | 2.4 | 10.74 | 0 | 0 |
| L618 | 1210 | 33.47 | 14.34 | 4.36 | 13.06 | 2 | 26.12 | 2.4 | 6.27 | 60 | 60 |
| L619 | 1490 | 26.51 | 7.46 | 1.49 | 5.31 | 2 | 10.62 | 2.4 | 2.55 | 60 | 60 |
| L620 | 1661 | 19.32 | 6.39 | 0.70 | 2.85 | 2 | 5.71 | 2.4 | 1.37 | 60 | 60 |

TABLE 6-continued

| Lens | $VZ_L[cm^3]$ | $\theta_L[°]$ | $OP_L[mm]$ | $CN_L[mm]$ | $SP_L[mm]$ | $DI_L$ | $KP_L[mm]$ | $MA_L[nm/cm]$ | $BF_L[nm]$ | $Y_L[°]$ | $\alpha_L[°]$ |
|---|---|---|---|---|---|---|---|---|---|---|---|
| L621 | 2399 | 6.66 | 7.99 | 0.11 | 0.50 | 2 | 1.00 | 2.4 | 0.24 | 60 | 60 |
| L622 | 2345 | 10.29 | 7.72 | 0.25 | 1.12 | 2 | 2.23 | 2.4 | 0.54 | 0 | 60 |
| L623 | 2700 | 11.93 | 9.61 | 0.41 | 1.83 | 2 | 3.66 | 2.4 | 0.88 | 60 | 0 |
| L624 | 3024 | 0.30 | 17.76 | 0.00 | 0.00 | 2 | 0.00 | 2.4 | 0.00 | 0 | 0 |
| L625 | 3786 | 6.00 | 16.32 | 0.18 | 0.83 | 2 | 1.66 | 2.4 | 0.40 | 0 | 0 |
| L626 | 1237 | 24.04 | 8.96 | 1.49 | 5.59 | 2 | 11.18 | 2.4 | 2.68 | 60 | 0 |
| L627 | 1099 | 35.63 | 8.02 | 2.72 | 7.64 | 2 | 15.27 | 2.4 | 3.66 | 60 | 0 |
| L628 | 621 | 39.44 | 11.99 | 4.84 | 11.92 | 2 | 23.83 | 2.4 | 5.72 | 0 | 60 |
| L629 | 279 | 35.27 | 25.66 | 8.55 | 24.27 | 2 | 48.53 | −7.2 | −34.95 | 0 | 60 |
| L630 | 113 | 35.27 | 24.47 | 8.16 | 23.14 | 2 | 46.28 | −7.2 | −33.32 | 60 | 0 |
| Sum | | | | | | | 377.11 | | −0.52 | | |

The combined material volume of the lenses L629 and L630, i.e., those lenses that are made of barium fluoride, amounts to 392 cm³, while the total material volume of all lenses is 0.38282 cm³. Thus, the ratio of the combined volume of the barium fluoride lenses to the total value of all lenses is 1.0%.

The small material volume for the barium fluoride lenses was achieved by selecting barium fluoride lenses for the positions where the light ray parameter values for the outer aperture ray 5 are largest. This is the case for the lenses L630 and L629.

In the barium fluoride lenses, the outer aperture ray 605 has a large aperture angle $\theta_L$. The maximum of all aperture angles, $\theta_L = 3900.4°$, occurs in the calcium fluoride lens L628. The lenses L629 and L630 each have aperture angles $\theta_L$ of 35.3°, which is more than 70% of the maximum aperture angle $\theta_L = 39.4°$.

The characteristic light ray quantity $CN_L$ is largest for the lens L629, i.e., 8.5 mm. The characteristic light ray quantity $CN_L$ for the lenses L629 and L630 is larger than 90% of 8.5 mm, which would be 7.6 mm.

In all of the calcium fluoride lenses, i.e., L601 to L628, the characteristic light ray quantities $CN_L$ are smaller than 75% of 8.5 mm, which would be 6.4 mm.

With a difference of only 0.9%, the absolute amount of the sum of the birefringence factors $BF_L$ of the barium fluoride lenses, i.e., 68.3 nm, is virtually equal to the absolute amount of the sum of the birefringence factors $BF_L$ of the calcium fluoride lenses, i.e., 67.7 nm.

The lenses of the objective 601 are assigned to the six homogeneous groups HG61 to HG66 with calcium fluoride lenses, and to the homogeneous group HG67 with barium fluoride lenses.

The lenses within each homogeneous group are, in turn, assigned to two subgroups UG1 and UG2. Equivalent crystallographic directions within a subgroup are oriented in the same direction if the angle of rotation γ between the lenses is 0°. The angle of rotation between two (111)-lenses of different subgroups is 60°.

The assignment of the lenses to the homogeneous groups and subgroups is shown in Table 7.

TABLE 7

| Homogeneous Group | Subgroup | Lenses | Sum Σ($BF_L$) |
|---|---|---|---|
| HG61 | UG1 | L607 | 3.30 |
| | UG2 | L601–L606 | 2.98 |
| HG62 | UG1 | L608 | 7.20 |
| | UG2 | L609 | 5.80 |

TABLE 7-continued

| Homogeneous Group | Subgroup | Lenses | Sum Σ($BF_L$) |
|---|---|---|---|
| HG63 | UG1 | L610–L612, L614 | 6.16 |
| | UG2 | L613 | 5.98 |
| HG64 | UG1 | L617 | 10.74 |
| | UG2 | L615, L616, L618–L620 | 11.48 |
| HG65 | UG1 | L623–L625 | 1.28 |
| | UG2 | L621, L622 | 0.77 |
| HG66 | UG1 | L626, L627 | 6.35 |
| | UG2 | L628 | 5.72 |
| HG67 | UG1 | L630 | −33.32 |
| | UG2 | L629 | −34.95 |

The condition $075·\Sigma_{HG}(BF_L) < 2·\Sigma_{UG}(BF_L) < 1,25·\Sigma_{HG}(BF_L)$ is met in each of the subgroups.

In the objective 601, the barium fluoride lenses L629 and L630, which form the homogeneous group HG67, are the last two lenses in the light path before the image plane IM.

The angle of rotation between any two lenses from different homogeneous groups has almost no influence on the compensation of the birefringence effects. This quantity remains available as a degree of freedom for the optimization of image errors that are not rotationally symmetric and can be caused by the manufacturing process or by technical factors in the lens mounts.

It is also possible to have an arrangement with only one homogeneous group HG68 of barium fluoride lenses and one homogeneous group HG69 of calcium fluoride lenses, each of which is subdivided into two subgroups.

The assignment of the lenses to the homogeneous groups and subgroups is shown in Table 8.

TABLE 8

| Homogeneous Group | Subgroup | Lenses | Sum Σ($BF_L$) [nm] |
|---|---|---|---|
| HG68 | UG1 | L630 | −33.32 |
| | UG2 | L629 | −34.95 |
| HG69 | UG1 | L607, L608, L610–L612, L614, L617, L623–L627 | 35.02 |
| | UG2 | L601–L606, L609, L613, L615, L616, L618–L622, L628 | 32.73 |

The condition $075·\Sigma_{HG}(BF_L) < 2·\Sigma_{UG}(BF_L) < 1,25·\Sigma_{HG}(BF_L)$ is met in each of the subgroups.

FIG. 7 illustrates the principal arrangement of a microlithography projection apparatus. The projection apparatus 701 has a light source 703, an illumination system 705, a mask 707 carrying a structure, a projection objective 709, and a substrate 711 that is to be exposed. The illumination system 705 collects the light of the light source 703, for example a KrF- or ArF-laser, depending on the working wavelength, and illuminates the mask 707. The illumination provides a specified degree of homogeneity of the light intensity distribution and a specified illuminated area at the entrance pupil of the objective 709. The mask 707 is held in the light path by means of a mask holder 713. Masks 713 of the type used in microlithography have a structure with details in the nanometer- to micrometer range. The mask carrying the structure can be a so-called reticle or, as alternatives, a controllable micro-mirror array or a programmable LCD array. The mask 707, or in some cases a portion of the mask, is projected by means of the projection objective 709 onto the substrate 711 that is positioned on a substrate holder 715. Examples of embodiments of the projection objective 709 are shown in FIG. 1 and FIG. 6. The substrate 711 is typically a silicon wafer carrying the so-called resist, i.e., a light-sensitive coating.

The limit of resolution for the smallest details of a mask structure depends on the wavelength λ of the light used for illumination and also on the numerical aperture on the image side of the projection objective 709. The ability of the projection apparatus 701 to resolve the smallest details of a structure increases as the wavelength λ of the light source 703 is decreased and as the numerical aperture on the image side of the projection objective 709 is increased. With the embodiments shown in FIG. 1 and FIG. 6, it is possible to achieve a resolution of details smaller than 150 nm. This is the reason why it is necessary to minimize effects such as the intrinsic birefringence. The invention has been successful in strongly reducing the detrimental influence of intrinsic birefringence particularly in projection objectives with a large numerical aperture on the image side by using combinations of at least two different lens materials or combinations of at least two different material orientations in the lenses, while at the same time minimizing the required volume of the material that is used as the combination partner for the compensation.

Further proposed under the present invention is a method of compensating the effects that occur as a result of birefringence in objectives with birefringent lenses. The method, which is explained below through a practical example, is based on the observation that the retardation between the aperture-/principal-ray retardation can be significantly reduced by the parallel use of (111)-lenses with (100)-lenses if the lenses are installed in appropriate orientations. The inventive method is specifically designed to reduce the amount of material required for the (100)-lenses.

The refractive objective of FIG. 1 with the optical data listed in Table 1 serves as example to explain the method. The orientation of the lens axes is used as optimization parameter.

As a preparatory step, the aperture angles $\theta_L$, optical path lengths $OP_L$, and light ray parameters $SP_L$ are calculated for the individual lenses. The results of this calculation are listed in Table 2.

In step A of the method, the lenses L101 to L130 are assigned either to a first homogeneous group HGI or to a second homogeneous group HGII. Tentatively, the two lenses with the largest characteristic light ray quantities $CN_L$ are assigned to the first homogeneous group HGI, and all other lenses are assigned to the second homogeneous group HGII. As a result of this tentative assignment, the first homogeneous group HGI will have the lenses L129 and L130, and the second homogeneous group will have the lenses L101 to L128.

In step B, a compensation parameter $$KP_L = DI_L * SP_L \tag{6}$$

is calculated for each of the lenses. The orientation parameter $DI_L$ for the lenses of the first homogeneous group is $DI_L = -3$, and for the lenses of the second homogeneous group it is $DI_L = +2$.

In step C, the sum $\Sigma_{HGI}(KP_L)$ is calculated for the compensation parameters $KP_L$ of the lenses of the first homogeneous group HGI, and the sum $\Sigma_{HGII}(KP_L)$ is calculated for the compensation parameters $KP_L$ of the lenses of the second homogeneous group HGII. The results of the calculation are listed in Table 9.

TABLE 9

| Homogeneous Group | Lenses | Sum Σ(KP$_L$) [mm] |
| --- | --- | --- |
| HGI | L129, L130 | −151.3 |
| HGII | L101–L128 | 281.9 |

In step D, a test is made as to whether the inequality $$|\Sigma_{HGI}(KP_L) + \Sigma_{HGII}(KP_L)| < |10\% \, \Sigma_{HGI}(KP_L)| \tag{7}$$

is true.

Since $|\Sigma_{HGI}(KP_L) + \Sigma_{HGII}(KP_L)| = 86.3\% \, \Sigma_{HGI}(KP_L)$, the foregoing condition (7) is not met, and the method therefore loops back to step A for a new assignment of the lenses to the first homogeneous group HGI and the second homogeneous group HGII.

The method steps a through D are reiterated until the inequality (7) is found to be true.

As a result of the iterative process, one ends up, e.g., with an assignment of the lenses to the homogenous groups as shown in Table 10.

TABLE 10

| Homogeneous Group | Lenses | Sum Σ(KP$_L$) [mm] |
| --- | --- | --- |
| HGI | L108, L109, L129, L130 | −232.4 |
| HGII | L101–L107, L110–L128 | 227.8 |

The solution according to Table 10 does not necessarily represent the only possibility to satisfy the condition (7). One could also choose to calculate the sums of the compensation parameters $KP_L$ for every possible assignment of every lens and to use the assignment with the minimum sum total for the continuation of the method.

In step E, the lens axes of the lenses of the first homogeneous group HGI are oriented in the (100)-direction and the lens axes of the lenses of the second homogeneous group HGII are oriented in the (111)-direction of the crystallographic structure.

In step F, the lenses in each of the first homogeneous group HGI and the second homogeneous group HGII are assigned to two subgroups. A starting assignment can be obtained by sorting the lenses in each of the homogeneous groups HGI and HGII in ascending order of their light ray parameter values $SP_L$. The lenses within each homogeneous group are then alternatingly assigned to one or the other of the two subgroups.

For the first homogeneous group HGI, the lenses L109 and L130 are thus assigned to one subgroup, and the lenses L108 and L129 are assigned to the other subgroup.

For the second homogeneous group HGII, the lenses L124, L111, L121, L103, L102, L104, L101, L115, L110, L126, L127, L128, and L118 are assigned to one subgroup, and the lenses L116, L112, L105, L125, L122, L106, L123, L120, L119, L107, L114, L113 and L117 are assigned to the other subgroup.

In step G, the sum $\Sigma_{UG}(KP_L)$ of the compensation parameters $KP_L$ of the lenses in a subgroup is calculated for each of the subgroups. The results are shown in Table 11.

TABLE 11

| Homogeneous Group | Subgroup | Lenses | Sum $\Sigma(KP_L)$ [mm] |
|---|---|---|---|
| HGI | UG1 | L109, L130 | −110.1 |
|  | UG2 | L108, L129 | −122.3 |
| HGII | UG1 | L124, L111, L121, L103, L102, L104, L101, L115, L110, L126, L127, L128, L118 | 97.3 |
|  | UG2 | L116, L112, L105, L125, L122, L106, L123, L120, L119, L107, L114, L113, L117 | 130.5 |

In step H, a test is made as to whether the inequality $$0.75 \cdot \Sigma_{HG}(BF_L) < n \cdot \Sigma_{UG}(BF_L) < 1.25 \cdot \Sigma_{HG}(BF_L) \quad (8)$$

is true for each of the subgroups.

The foregoing condition (8) is met for all subgroups.

In step I, the lenses of a homogeneous group are rotated relative to their lens axes so that the principal crystallographic directions of the lenses in each subgroup run in approximately the same direction. Consequently, the angle of rotation between two lenses in a subgroup is 0°. In step J, the individual subgroups are rotated about the lens axes so that the angle of rotation between any two lenses of different subgroups is $\gamma_0/n + m^{-1} \gamma_0$, where m is a positive integer. The angle $\gamma_0$ equals 120° if the lens axes are oriented in the (111)-direction of the crystallographic structure, and 90° if the lens axes are oriented in the (100)-direction of the crystallographic structure. As a result, the azimuth angle of the outer aperture ray 5 will have the values indicated in Table 12.

TABLE 12

| Homogeneous Group | Subgroup | Lenses | $\gamma_L$ [°] |
|---|---|---|---|
| HGI | UG1 | L109, L130 | 0 |
|  | UG2 | L108, L129 | 45 |
| HGII | UG1 | L124, L111, L121, L103, L102, L104, L101, L115, L110, L126, L128, L128, L118 | 0 |
|  | UG2 | L116, L112, L105, L125, L122, L106, L123, L120, L119, L107, L114, L113, L117 | 60 |

Another possibility for assigning the lenses to subgroups, where the condition (8) is likewise fulfilled, is shown in Table 4.

The method provides a further step towards optimization to bring the sum of the compensation parameters $\Sigma_{HGI}(KP_L) + \Sigma_{HGII}(KP_L)$ as close to zero as possible.

This is accomplished by reducing the thickness of the lenses L129 and L130 ins such a way that $|\Sigma_{HGI}(KP_L) + \Sigma_{HGII}(KP_L)| \approx 0$.

If the thickness of the lens L129 is changed from 22.261 mm to 21.593 mm and the thickness of the lens L130 is changed from 21.228 mm to 20.591 mm, i.e., in each case by a factor of 0.97, the characteristic data of the lenses L129' and L130' will be as shown in Table 13.

TABLE 13

| Lens | $VZ_L$ [cm³] | $\theta_L$ [°] | $OP_L$ [mm] | $CN_L$ [mm] | $SP_L$ [mm] | $DI_L$ | $KP_L$ [mm] | $MA_L$ [nm/cm] | $BF_L$ [nm] | $\alpha_L$ [°] |
|---|---|---|---|---|---|---|---|---|---|---|
| L101 | 138 | 8.1 | 15.1 | 0.30 | 1.38 | 2 | 2.75 | 2.4 | 0.66 | 60 |
| ... | ... | ... | ... | ... | ... | ... | ... | ... | ... | ... |
| L128 | 665 | 39.4 | 12 | 4.83 | 11.93 | 2 | 23.85 | 2.4 | 5.72 | 60 |
| L129' | 320 | −35.3 | 26.481 | 8.842 | 25.06 | −3 | −75.18 | 2.4 | −18.04 | 45 |
| L130' | 126 | −35.3 | 25.22 | 8.421 | 23.87 | −3 | −71.60 | 2.4 | −17.18 | 0 |
| Sum |  |  |  |  |  |  | −0.07 |  | −0.02 |  |

Thus, the sum $|\Sigma_{HGI}(KP_L) + \Sigma_{HGII}(KP_L)| = 0.07$ mm is significantly smaller than the sum $|\Sigma_{HGI}(KP_L) + \Sigma_{HGII}(KP_L)| = 4.6$ mm that was obtained for the objective without the thickness correction.

If the thickness correction causes other aberrations, the correction quality of the objective may be restored or further improved through known methods of optimization, making adjustments in the lens radii and possibly in the aspheric parameters of the lenses.

As a concept of general validity, the sum of the compensation parameters $|\Sigma_{HGI}(KP_L) + \Sigma_{HGII}(KP_L)| \approx 0$ can be used as a further optimization parameter in the design of objectives and can for example be incorporated in optimization algorithms.

TABLE 1

| LENSES | RADII | THICKNESSES | MATERIALS | REFRACT. INDEX AT 157.629 nm | ½ FREE DIAMETER |
|---|---|---|---|---|---|
| OB | 0.000000000 | 27.171475840 | N2 | 1.00031429 | 46.200 |
|  | 0.000000000 | 0.602670797 | N2 | 1.00031429 | 52.673 |
| L101 | 900.198243311AS | 15.151284556 | CaF2 | 1.55929035 | 53.454 |
|  | −235.121108435 | 9.531971079 | N2 | 1.00031429 | 54.049 |
| L102 | −167.185917779 | 8.294716452 | CaF2 | 1.55929035 | 54.178 |
|  | −132.673519510 | 14.020355779 | N2 | 1.00031429 | 54.901 |
| L103 | −333.194588652 | 9.893809820 | CaF2 | 1.55929035 | 53.988 |
|  | −155.450516203 | 15.930502944 | N2 | 1.00031429 | 54.132 |
| L104 | −73.572316296 | 7.641977580 | CaF2 | 1.55929035 | 53.748 |
|  | −68.248613899AS | 2.881720302 | N2 | 1.00031429 | 55.167 |
| L105 | −86.993585564AS | 5.094651720 | CaF2 | 1.55929035 | 52.580 |
|  | −238.150965327 | 5.379130780 | N2 | 1.00031429 | 53.729 |
| L106 | −165.613920870 | 5.094651720 | CaF2 | 1.55929035 | 53.730 |
|  | 153.417884485 | 34.150169591 | N2 | 1.00031429 | 56.762 |
| L107 | −92.061009990 | 5.094651720 | CaF2 | 1.55929035 | 58.081 |
|  | 8491.086261873AS | 19.673523795 | N2 | 1.00031429 | 74.689 |
| L108 | −407.131300451 | 30.380807138 | CaF2 | 1.55929035 | 87.291 |
|  | −140.620317156 | 0.761662684 | N2 | 1.00031429 | 91.858 |
| L109 | −4831.804853654AS | 50.269660218 | CaF2 | 1.55929035 | 117.436 |
|  | −192.197373609 | 1.688916911 | N2 | 1.00031429 | 121.408 |
| L110 | −367.718684892 | 21.227715500 | CaF2 | 1.55929035 | 127.704 |
|  | −233.628547894 | 2.224071019 | N2 | 1.00031429 | 129.305 |
| L111 | 709.585855080 | 28.736922725 | CaF2 | 1.55929035 | 137.016 |
|  | 1238.859445357 | 9.120684720 | N2 | 1.00031429 | 137.428 |
| L112 | 1205.457051945 | 49.281218258 | CaF2 | 1.55929035 | 138.288 |
|  | −285.321880705 | 1.625271224 | N2 | 1.00031429 | 138.379 |
| L113 | 137.549591710 | 56.718543740 | CaF2 | 1.55929035 | 108.652 |
|  | −4380.301012978AS | 0.623523902 | N2 | 1.00031429 | 106.138 |
| L114 | 2663.880214408 | 6.792868960 | CaF2 | 1.55929035 | 103.602 |
|  | 149.184979730 | 15.779049257 | N2 | 1.00031429 | 84.589 |
| L115 | 281.093108064 | 6.792868960 | CaF2 | 1.55929035 | 83.373 |
|  | 184.030288413 | 32.341552355 | N2 | 1.00031429 | 77.968 |
| L116 | −222.157416308 | 5.094651720 | CaF2 | 1.55929035 | 77.463 |
|  | 101.254238115AS | 56.792834221 | N2 | 1.00031429 | 71.826 |
| L117 | −106.980638018 | 5.094651720 | CaF2 | 1.55929035 | 72.237 |
|  | 1612.305471130 | 20.581065398 | N2 | 1.00031429 | 89.760 |
| L118 | −415.596135628 | 26.398111993 | CaF2 | 1.55929035 | 96.803 |
|  | −204.680044631 | 0.713343960 | N2 | 1.00031429 | 103.409 |
| L119 | −646.696622394 | 25.867340760 | CaF2 | 1.55929035 | 116.636 |
|  | −231.917626896 | 0.766268682 | N2 | 1.00031429 | 118.569 |
| L120 | −790.657607677 | 23.400482872 | CaF2 | 1.55929035 | 128.806 |
|  | −294.872053725 | 0.721402031 | N2 | 1.00031429 | 130.074 |
| L121 | 786.625567756 | 40.932308205 | CaF2 | 1.55929035 | 141.705 |
|  | −431.247283013 | 12.736629300 | N2 | 1.00031429 | 142.089 |
| AS | 0.000000000 | −8.491086200 | N2 | 1.00031429 | 134.586 |
| L122 | 295.022653593AS | 20.185109438 | CaF2 | 1.55929035 | 139.341 |
|  | 449.912291916 | 0.619640486 | N2 | 1.00031429 | 137.916 |
| L123 | 358.934076212 | 48.662890509 | CaF2 | 1.55929035 | 136.936 |
|  | −622.662988878 | 30.955714157 | N2 | 1.00031429 | 135.288 |
| L124 | −224.404889753 | 12.736629300 | CaF2 | 1.55929035 | 134.760 |
|  | −251.154571510AS | 16.079850229 | N2 | 1.00031429 | 134.853 |
| L125 | −193.582989843AS | 16.510083506 | CaF2 | 1.55929035 | 134.101 |
|  | −198.077570749 | 0.880353872 | N2 | 1.00031429 | 136.109 |
| L126 | 206.241795157 | 19.927993542 | CaF2 | 1.55929035 | 101.240 |
|  | 338.140581666 | 0.925956949 | N2 | 1.00031429 | 97.594 |
| L127 | 111.017549581 | 24.580089962 | CaF2 | 1.55929035 | 85.023 |
|  | 169.576109839 | 0.777849447 | N2 | 1.00031429 | 81.164 |
| L128 | 117.982165264 | 31.161065630 | CaF2 | 1.55929035 | 75.464 |
|  | 921.219058213AS | 6.934980174 | N2 | 1.00031429 | 69.501 |
| L129 | 0.000000000 | 22.260797322 | CaF2 | 1.55929035 | 63.637 |
|  | 0.000000000 | 4.245543100 | N2 | 1.00031429 | 48.606 |

TABLE 1-continued

| | | | | | |
|---|---|---|---|---|---|
| L130 | 0.000000000 | 21.227715500 | CaF2 | 1.55929035 | 41.032 |
| | 0.000000000 | 8.491086200 | N2 | 1.00031429 | 26.698 |
| IM | 0.000000000 | 0.000000000 | | 1.00000000 | 11.550 |

Wavelength and refractive index are stated relative to vacuum
N2 = nitrogen
CaF2 = Calcium Fluoride Calculation formula for aspheres:

$$z = \frac{\frac{1}{R}h^2}{1 + \sqrt{1 - (1+K)\left(\frac{1}{R}\right)^2 h^2}} + \sum_{k=1} C_k h^{2k+2}$$

z: surface sagitta (lens surface coordinate measured parallel to lens axis)
h: height (lens surface coordinate measured perpendicular to lens axis)
R: surface curvature radius at center of lens
$C_k$: aspheric constants
K: conical constant

ASPHERIC CONSTANTS

| Asphere of lens L101 | | Asphere of lens L109 | | Asphere of lens L124 | |
|---|---|---|---|---|---|
| K | 0.0000 | K | 0.0000 | K | 0.0000 |
| C1 | 1.28594437e−007 | C1 | 6.85760526e−009 | C1 | 3.02835805e−010 |
| C2 | 8.50731836e−013 | C2 | −4.84524868e−013 | C2 | −2.40484062e−014 |
| C3 | 1.16375620e−016 | C3 | −6.28751350e−018 | C3 | −3.22339189e−019 |
| C4 | 2.28674275e−019 | C4 | −3.72607209e−022 | C4 | 1.64516979e−022 |
| C5 | −1.23202729e−022 | C5 | 3.25276841e−026 | C5 | −8.51268614e−027 |
| C6 | 3.32056239e−026 | C6 | −4.05509974e−033 | C6 | 2.09276792e−031 |
| C7 | −4.28323389e−030 | C7 | −3.98843079e−035 | C7 | −4.74605669e−036 |
| C8 | 0.00000000e+000 | C8 | 0.00000000e+000 | C8 | 0.00000000e+000 |
| C9 | 0.00000000e+000 | C9 | 0.00000000e+000 | C9 | 0.00000000e+000 |
| Asphere of lens L104 | | Asphere of lens L113 | | Asphere of lens L125 | |
| K | −1.3312 | K | 0.0000 | K | 0.0000 |
| C1 | −4.03355456e−007 | C1 | 2.24737416e−008 | C1 | −3.99248993e−010 |
| C2 | 2.25776586e−011 | C2 | −4.45043770e−013 | C2 | 5.79276562e−014 |
| C3 | −2.19259878e−014 | C3 | −4.10272049e−017 | C3 | 3.53241478e−018 |
| C4 | 4.32573397e−018 | C4 | 4.31632628e−021 | C4 | −4.57872308e−023 |
| C5 | −7.92477159e−022 | C5 | −3.27538237e−025 | C5 | −6.29695208e−027 |
| C6 | 7.57618874e−026 | C6 | 1.44053025e−029 | C6 | 1.57844931e−031 |
| C7 | −7.14962797e−030 | C7 | −2.76858490e−034 | C7 | −2.19266130e−036 |
| C8 | 0.00000000e+000 | C8 | 0.00000000e+000 | C8 | 0.00000000e+000 |
| C9 | 0.00000000e+000 | C9 | 0.00000000e+000 | C9 | 0.00000000e+000 |
| Asphere of lens L105 | | Asphere of lens L116 | | Asphere of lens L128 | |
| K | −1.1417 | K | 0.0000 | K | 0.0000 |
| C1 | 1.33637337e−007 | C1 | −2.83553693e−008 | C1 | 4.40737732e−008 |
| C2 | 1.56787758e−011 | C2 | −1.12122261e−011 | C2 | 1.52385268e−012 |
| C3 | −1.64362484e−014 | C3 | −2.05192812e−016 | C3 | −5.44510329e−016 |
| C4 | 3.59793786e−018 | C4 | −1.55525080e−020 | C4 | 6.32549789e−020 |
| C5 | −5.11312568e−022 | C5 | −4.77093112e−024 | C5 | −4.58358203e−024 |
| C6 | 1.70636633e−026 | C6 | 8.39331135e−028 | C6 | 1.92230388e−028 |
| C7 | 1.82384731e−030 | C7 | −8.97313681e−032 | C7 | −3.11311258e−033 |
| C8 | 0.00000000e+000 | C8 | 0.00000000e+000 | C8 | 0.00000000e+000 |
| C9 | 0.00000000e+000 | C9 | 0.00000000e+000 | C9 | 0.00000000e+000 |
| Asphere of lens L107 | | Asphere of lens L122 | | | |
| K | 0.0000 | K | 0.0421 | | |
| C1 | 1.34745120e−007 | C1 | 7.07310826e−010 | | |
| C2 | −2.19807543e−011 | C2 | −2.00157185e−014 | | |
| C3 | 1.20275881e−015 | C3 | −9.33825109e−020 | | |
| C4 | 4.39597377e−020 | C4 | 1.27125854e−024 | | |
| C5 | −2.37132819e−023 | C5 | 1.94008709e−027 | | |
| C6 | 2.87510939e−027 | C6 | −6.11989858e−032 | | |
| C7 | −1.42065162e−031 | C7 | 2.92367322e−036 | | |
| C8 | 0.00000000e+000 | C8 | 0.00000000e+000 | | |
| C9 | 0.00000000e+000 | C9 | 0.00000000e+000 | | |

TABLE 5

| LENSES | RADII | THICKNESSES | MATERIALS | REFRACT. INDEX AT 157.629 nm | ½ FREE DIAMETER |
|---|---|---|---|---|---|
| OB | 0.000000000 | 27.171000000 | N2 | 1.00031429 | 46.200 |
|  | 0.000000000 | 0.602700000 | N2 | 1.00031429 | 52.483 |
| L601 | 1061.675826556AS | 13.953625578 | CAF2 | 1.55929035 | 53.172 |
|  | −222.590363847 | 11.082142717 | N2 | 1.00031429 | 53.657 |
| L602 | −157.249356272 | 7.543745668 | CAF2 | 1.55929035 | 53.764 |
|  | −129.324382164 | 15.230914993 | N2 | 1.00031429 | 54.447 |
| L603 | −298.401442448 | 9.897431811 | CAF2 | 1.55929035 | 53.507 |
|  | −152.990410012 | 15.530980470 | N2 | 1.00031429 | 53.699 |
| L604 | −73.804349727 | 7.511974381 | CAF2 | 1.55929035 | 53.310 |
|  | −68.772866079AS | 2.469611066 | N2 | 1.00031429 | 54.703 |
| L605 | −86.143995548AS | 5.000000000 | CAF2 | 1.55929035 | 52.468 |
|  | −161.227481163 | 4.725748925 | N2 | 1.00031429 | 53.444 |
| L606 | −130.938329597 | 5.000000000 | CAF2 | 1.55929035 | 53.304 |
|  | 155.316507259 | 34.191133253 | N2 | 1.00031429 | 56.604 |
| L607 | −93.255132327 | 5.130318518 | CAF2 | 1.55929035 | 58.163 |
|  | 7486.670901531AS | 19.490322221 | N2 | 1.00031429 | 74.401 |
| L608 | −420.536288297 | 30.454322229 | CAF2 | 1.55929035 | 86.904 |
|  | −143.722201412 | 0.681802949 | N2 | 1.00031429 | 91.871 |
| L609 | −3624.350424629AS | 50.428029160 | CAF2 | 1.55929035 | 116.035 |
|  | −193.918240338 | 1.648626119 | N2 | 1.00031429 | 120.723 |
| L610 | −381.431673592 | 21.494074503 | CAF2 | 1.55929035 | 127.148 |
|  | −235.399633112 | 0.500394232 | N2 | 1.00031429 | 128.718 |
| L611 | 670.712968508 | 22.239667779 | CAF2 | 1.55929035 | 136.294 |
|  | −3055.972758241 | 6.194278465 | N2 | 1.00031429 | 136.374 |
| L612 | −3405.412865559 | 38.831158026 | CAF2 | 1.55929035 | 136.368 |
|  | −285.128387832 | 2.978032471 | N2 | 1.00031429 | 136.461 |
| L613 | 138.668125230 | 57.186436823 | CAF2 | 1.55929035 | 107.504 |
|  | −3173.419655113AS | 0.784917089 | N2 | 1.00031429 | 103.844 |
| L614 | 2840.159832729 | 6.872193317 | CAF2 | 1.55929035 | 100.789 |
|  | 145.833126675 | 16.759830250 | N2 | 1.00031429 | 82.406 |
| L615 | 296.211925630 | 7.300559586 | CAF2 | 1.55929035 | 80.997 |
|  | 195.715007323 | 31.346449982 | N2 | 1.00031429 | 75.884 |
| L616 | −213.690213092 | 5.847699943 | CAF2 | 1.55929035 | 74.682 |
|  | 101.827276654AS | 61.033500873 | N2 | 1.00031429 | 69.360 |
| L617 | −108.150341946 | 5.406942168 | CAF2 | 1.55929035 | 71.664 |
|  | 1262.605969309 | 20.791804856 | N2 | 1.00031429 | 88.101 |
| L618 | −411.476339848 | 26.607794783 | CAF2 | 1.55929035 | 94.680 |
|  | −198.851000275 | 1.066850502 | N2 | 1.00031429 | 101.126 |
| L619 | −805.359774792 | 26.181501868 | CAF2 | 1.55929035 | 114.923 |
|  | −251.910697660 | 1.467243822 | N2 | 1.00031429 | 117.377 |
| L620 | −1008.131874684 | 24.151274039 | CAF2 | 1.55929035 | 126.706 |
|  | −316.472185448 | 2.185687274 | N2 | 1.00031429 | 128.233 |
| L621 | 932.984348579 | 40.192256872 | CAF2 | 1.55929035 | 137.396 |
|  | −392.303927560 | 12.736600000 | N2 | 1.00031429 | 137.847 |
| AS | 0.000000000 | −8.491100000 | N2 | 1.00031429 | 135.318 |
| L622 | 284.837295967AS | 20.896784451 | CAF2 | 1.55929035 | 136.344 |
|  | 486.071969432 | 0.503770121 | N2 | 1.00031429 | 135.482 |
| L623 | 381.111228515 | 47.237624183 | CAF2 | 1.55929035 | 134.883 |
|  | −669.908935384 | 31.063729028 | N2 | 1.00031429 | 133.054 |
| L624 | −228.427422993 | 13.144938673 | CAF2 | 1.55929035 | 131.858 |
|  | −255.766924263AS | 16.107278882 | N2 | 1.00031429 | 132.249 |
| L625 | −195.692064836AS | 17.149572861 | CAF2 | 1.55929035 | 131.277 |
|  | −200.536497727 | 2.818541941 | N2 | 1.00031429 | 133.413 |
| L626 | 201.606747686 | 20.267700093 | CAF2 | 1.55929035 | 103.552 |
|  | 312.077129121 | 1.754977081 | N2 | 1.00031429 | 99.969 |
| L627 | 108.598460895 | 24.609082224 | CAF2 | 1.55929035 | 86.005 |
|  | 160.779335167 | 0.982116925 | N2 | 1.00031429 | 82.331 |
| L628 | 111.413514340 | 31.169293264 | CAF2 | 1.55929035 | 75.746 |
|  | 756.917707588AS | 7.077400545 | N2 | 1.00031429 | 70.716 |
| L629 | 0.000000000 | 20.925000000 | BAF2 | 1.65671094 | 65.146 |
|  | 0.000000000 | 4.387900541 | N2 | 1.00031429 | 51.575 |

TABLE 5-continued

| | | | | | |
|---|---|---|---|---|---|
| L630 | 0.000000000 | 19.964000000 | BAF2 | 1.65671094 | 42.450 |
| | 0.000000000 | 8.633490536 | N2 | 1.00031429 | 29.502 |
| IM | 0.000000000 | 0.000000000 | | 1.00000000 | 11.550 |

N2 = nitrogen
CaF2 = calcium fluoride
BaF2 = barium fluoride

Calculation formula for aspheres:

$$z = \frac{\frac{1}{R}h^2}{1 + \sqrt{1 - (1+K)\left(\frac{1}{R}\right)^2 h^2}} + \sum_{k=1} C_k h^{2k+2}$$

z: surface sagitta (lens surface coordinate measured parallel to lens axis)
h: height (lens surface coordinate measured perpendicular to lens axis)
R: surface curvature radius at center of lens
$C_k$: aspheric constants
K: conical constant

ASPHERIC CONSTANTS

| | Asphere of lens L601 | | Asphere of lens L609 | | Asphere of lens L624 |
|---|---|---|---|---|---|
| K | 0.0000 | K | 0.0000 | K | 0.0000 |
| C1 | 1.27093579e−007 | C1 | 6.85758229e−009 | C1 | 3.11597757e−010 |
| C2 | 7.76927592e−013 | C2 | −4.88429053e−013 | C2 | −2.30718484e−014 |
| C3 | −4.41999773e−017 | C3 | −6.40561776e−018 | C3 | −3.44266709e−019 |
| C4 | 2.78179181e−019 | C4 | −3.87529291e−022 | C4 | 1.54982059e−022 |
| C5 | −1.12372551e−022 | C5 | 3.22424045e−026 | C5 | −9.00359911e−027 |
| C6 | 2.18773879e−026 | C6 | 3.42441759e−032 | C6 | 2.05547193e−031 |
| C7 | −2.18334910e−030 | C7 | −4.01546184e−035 | C7 | −4.18679528e−036 |
| C8 | 0.00000000e+000 | C8 | 0.00000000e+000 | C8 | 0.00000000e+000 |
| C9 | 0.00000000e+000 | C9 | 0.00000000e+000 | C9 | 0.00000000e+000 |
| | Asphere of lens L604 | | Asphere of lens L613 | | Asphere of lens L625 |
| K | −1.3312 | K | 0.0000 | K | 0.0000 |
| C1 | −4.02420475e−007 | C1 | 2.24065736e−008 | C1 | −4.08421793e−010 |
| C2 | 2.20581650e−011 | C2 | −4.47580423e−013 | C2 | 5.68649142e−014 |
| C3 | −2.20083645e−014 | C3 | −4.08430163e−017 | C3 | 3.49523839e−018 |
| C4 | 4.39133697e−018 | C4 | 4.34954531e−021 | C4 | −4.55232668e−023 |
| C5 | −7.92600342e−022 | C5 | −3.28276786e−025 | C5 | −6.60458404e−027 |
| C6 | 7.86008305e−026 | C6 | 1.42013157e−029 | C6 | 1.30837939e−031 |
| C7 | −7.49130102e−030 | C7 | −2.61180809e−034 | C7 | −8.08769377e−037 |
| C8 | 0.00000000e+000 | C8 | 0.00000000e+000 | C8 | 0.00000000e+000 |
| C9 | 0.00000000e+000 | C9 | 0.00000000e+000 | C9 | 0.00000000e+000 |
| | Asphere of lens L605 | | Asphere of lens L616 | | Asphere of lens L628 |
| K | −1.1417 | K | 0.0000 | K | 0.0000 |
| C1 | 1.31661037e−007 | C1 | −2.85549971e−008 | C1 | 4.37943974e−008 |
| C2 | 1.52909621e−011 | C2 | −1.12809529e−011 | C2 | 1.52437255e−012 |
| C3 | −1.64673550e−014 | C3 | −1.98046472e−016 | C3 | −5.29226023e−016 |
| C4 | 3.57801900e−018 | C4 | −1.75029023e−020 | C4 | 6.10946275e−020 |
| C5 | −4.89592608e−022 | C5 | −4.90027056e−024 | C5 | −4.89965852e−024 |
| C6 | 2.43358423e−026 | C6 | 8.60816174e−028 | C6 | 2.89803396e−028 |
| C7 | 5.42673243e−031 | C7 | −8.77108451e−032 | C7 | −8.88090890e−033 |
| C8 | 0.00000000e+000 | C8 | 0.00000000e+000 | C8 | 0.00000000e+000 |
| C9 | 0.00000000e+000 | C9 | 0.00000000e+000 | C9 | 0.00000000e+000 |
| | Asphere of lens L607 | | Asphere of lens L622 | | |
| K | 0.0000 | K | 0.0421 | | |
| C1 | 1.34746166e−007 | C1 | 7.33394387e−010 | | |
| C2 | −2.19707980e−011 | C2 | −2.21444405e−014 | | |
| C3 | 1.19809933e−015 | C3 | −9.51149419e−020 | | |
| C4 | 4.41304795e−020 | C4 | 2.68776283e−024 | | |
| C5 | −2.36028272e−023 | C5 | 1.96816684e−027 | | |
| C6 | 2.85976490e−027 | C6 | −6.36216640e−032 | | |
| C7 | −1.39202611e−031 | C7 | 2.62484068e−036 | | |
| C8 | 0.00000000e+000 | C8 | 0.00000000e+000 | | |
| C9 | 0.00000000e+000 | C9 | 0.00000000e+000 | | |

What is claimed is:

1. An objective with first birefringent lenses and with second birefringent lenses,
wherein the first lenses are distinguished from the second lenses by a lens material used or by a material orientation,
wherein a bundle of light rays originates from an object point with an outer aperture ray and a principal ray that have a wavelength and, in each of the lenses, an aperture angle,
wherein in each of the first lenses and in each of the second lenses the outer aperture ray and the principal ray are subject to an optical path difference for two mutually orthogonal states of polarization, said optical path difference being dependent on at least the aperture angle in the respective lens,
wherein after passing through the first lenses and the second lenses, a difference between a total optical path difference of the outer aperture ray and a total optical path difference of the principal ray for two mutually orthogonal states of polarization is smaller than 25% of the wavelength,
wherein in at least one of the first lenses, the aperture angle of the outer aperture ray is at least 70% of the largest aperture angle occurring for said outer aperture ray in all of the first and second lenses, and
wherein the first lenses have a combined material volume of no more than 20% of the combined material volume of all of the first and second lenses.

2. The objective according to claim 1,
wherein the first birefringent lenses and the second birefringent lenses comprise of a fluoride crystal material of cubic crystallographic structure and have lens axes running approximately in a principal crystallographic direction of the fluoride crystal,
wherein either all of the first lenses and all of the second lenses are of the same lens material, while at the same time the lens axes of the first lenses are oriented in principal crystallographic directions that are not equivalent to the principal crystallographic directions in which the lens axes of the second lenses are oriented,
or wherein all of the first lenses are of a different lens material than all of the second lenses, while at the same time the lens axes of all of the first lenses and the lens axes of all of the second lenses are oriented in the same principal crystallographic direction or in equivalent principal crystallographic directions.

3. The objective according to claim 2, wherein a light ray passing through a first lens or a second lens in the direction of the lens axis is subject to almost no optical path difference for two mutually orthogonal states of polarization.

4. The objective according to claim 3, wherein the lens axes of the first lenses or of the second lenses are either oriented in the <100> -direction or an equivalent principal crystallographic direction, or they are oriented in the <111>-direction or an equivalent principal crystallographic direction.

5. The objective according to claim 4, wherein all of the first lenses are of barium fluoride and all of the second lenses are of calcium fluoride.

6. The objective according to claim 5, wherein the lens axes of the first lenses and the lens axes of the second lenses are oriented in the <100>-direction of the crystallographic structure or in a principal crystallographic direction that is equivalent to the <100>-direction.

7. The objective according to claim 5, wherein the lens axes of the first lenses and the lens axes of the second lenses are oriented in the <111>-direction of the crystallographic structure or in a principal crystallographic direction that is equivalent to the <111>-direction.

8. An objective with first birefringent lenses of barium fluoride and with second birefringent lenses of calcium fluoride,
wherein a bundle of light rays originates from an object point with an outer aperture ray and a principal ray that have a wavelength and, in each of the lenses, an aperture angle,
wherein after passing through the first lenses and the second lenses, a difference between a total optical path difference of the outer aperture ray and a total optical path difference of the principal ray for two mutually orthogonal states of polarization is smaller than 25% of the wavelength,
wherein in at least one of the first lenses, the aperture angle of the outer aperture ray is at least 70% of the largest aperture angle occurring for said outer aperture ray in all of the first and second lenses, and
wherein the first lenses have a combined material volume of no more than 20% of the combined material volume of all of the first and second lenses.

9. The objective according to claim 8, wherein the lenses have lens axes which for all of the first lenses and all of the second lenses are either oriented in the <100>-direction of the crystallographic structure or in a principal crystallographic direction that is equivalent to the <100>-direction, or they are oriented in the <111>-direction of the crystallographic structure or in a principal crystallographic direction that is equivalent to the <111>-direction.

10. The objective according to claim 4, wherein all of the first lenses and all of the second lenses are of calcium fluoride.

11. The objective according to claim 10, wherein the lens axes of the first lenses are oriented in the <100>-direction of the crystallographic structure or in a principal crystallographic direction that is equivalent to the <100>-direction, and the lens axes of the second lenses are oriented in the <111>-direction of the crystallographic structure or in a principal crystallographic direction that is equivalent to the <111>-direction.

12. The objective according to claim 1, wherein the lenses have lens axes and wherein at least two first lenses form a homogeneous group and at least two second lenses form a homogeneous group, wherein the lenses of a homogeneous group are arranged with an angle of rotation relative to each other about the lens axes such that the outer aperture ray within the homogeneous group is subject to an optical path difference for two mutually orthogonal states of polarization that is nearly independent of an azimuth angle of the ray.

13. The objective according to claim 12, wherein a light ray in a homogeneous group is subject to an optical path difference for two mutually orthogonal states of polarization that increases with an increasing aperture angle.

14. The objective according to claim 12, wherein all of the first lenses are assigned to homogeneous groups and all of the second lenses are assigned to homogeneous groups.

15. The objective according to claim 14, wherein all first lenses form one homogeneous group and all second lenses form a further homogeneous group.

16. The objective according to claim 12, wherein the first birefringent lenses and the second birefringent lenses are of a fluoride crystal material of cubic crystallographic structure.

17. The objective according to claim 16, wherein each of the lenses of a homogeneous group has a birefringence distribution $\Delta n(\theta_L,\alpha_L)$ whose birefringence values $\Delta n$ are dependent on azimuth angles $\alpha_L$ relative to a reference direction that is perpendicular to the lens axis, and further dependent on aperture angles $\theta_L$ relative to the lens axis, wherein the birefringence distribution $\Delta n(\theta_L,\alpha_L)$ has a k-fold azimuthal symmetry, wherein angles of rotation $\gamma$ are defined between the reference directions of the individual lenses, wherein a number n of subgroups form a homogeneous group, wherein in a homogeneous group, the lens axes of the lenses run in the same principal crystallographic direction or in equivalent crystallographic directions and the birefringence distributions $\Delta n(\theta_L,\alpha_L)$ relative to the reference directions have the same azimuthal profiles, wherein each of the n subgroups has at least one lens, wherein the angles of rotation $\gamma$ between the lenses of a subgroup have values conforming to the equation $$\gamma = l \cdot \frac{360°}{k} \pm 10°,$$

where l represents an integer, and wherein any two lenses belonging to two different subgroups have an angle of rotation between each other that conforms to the equation $$\gamma = \frac{360°}{k \cdot n} + m \cdot \frac{360°}{k} \pm 10°,$$

where m represents an integer.

18. The objective according to claim 16 with at least one homogeneous group consisting of lenses whose lens axes run in the <111>-direction or an equivalent principal crystallographic direction, wherein between any two lenses of the homogeneous group an angle of rotation is defined so that the angle is 0° if equivalent principal crystallographic directions of the two lenses run in approximately equal directions, and wherein the angle of rotation between any two lenses of the homogeneous group is either 0°+m·120°±10° or 60°+m·120°±10°, where m represents an integer number.

19. The objective according to claim 16 with at least one homogeneous group consisting of lenses whose lens axes run in the <100>-direction or an equivalent principal crystallographic direction, wherein between any two lenses of the homogeneous group an angle of rotation is defined so that the angle is 0° if equivalent principal crystallographic directions of the two lenses run in approximately equal directions, and wherein the angle of rotation between any two lenses of the homogeneous group is either 0°+m·90°±10° or 45°+m·90°±10°, where m represents an integer number.

20. The objective according to claim 16, wherein each first lens and each second lens has a birefringence factor $BF_L$ that is defined as $BF_L = MA_L \cdot DI_L \cdot SP_L$, where a material parameter $MA_L$ depends on the lens material and an orientation parameter $DI_L$ depends on the material orientation, where the respective multiplication products $MA_L \cdot DI_L$ for first and second lenses have opposite signs, and wherein $SP_L$ represents a light ray parameter that is defined as $SP_L(\theta_L, OP_L) = OP_L \cdot \frac{7}{9} \sin^2\theta_L (7 \cdot \cos^2\theta_L - 1)$, where $OP_L$ represents the light path length of the outer aperture ray of the lens, $\theta_L$ represents the aperture angle of the outer aperture ray in the lens, and wherein the absolute value of the sum of all birefringence factors $BF_L$ of the first lenses alone equals the absolute value of the sum of all birefringence factors $BF_L$ of the second lenses with a deviation of no more than ±10%.

21. The objective according to claim 16, wherein each first lens and each second lens has a birefringence factor $BF_L$ that is defined as $BF_L = MA_L \cdot DI_L \cdot SP_L$, where a material parameter $MA_L$ depends on the lens material and an orientation parameter $DI_L$ depends on the material orientation, where the respective multiplication products $MA_L \cdot DI_L$ for first and second lenses have opposite signs, and wherein $SP_L$ represents a light ray parameter that is defined as $SP_L = OP_L \cdot \sin^2(2,17 \cdot \theta_L)$, where $OP_L$ represents the light path length of the outer aperture ray of the lens, $\theta_L$ represents the aperture angle of the outer aperture ray in the lens, and wherein the absolute value of the sum of all birefringence factors $BF_L$ of the first lenses alone equals the absolute value of the sum of all birefringence factors $BF_L$ of the second lenses with a deviation of no more than ±10%.

22. The objective according to claim 20, wherein a lens that consists of fluoride crystal material of cubic crystallographic structure and whose lens axis runs in the <100>-direction or in an equivalent principal crystallographic has an orientation parameter $DI_L$ of −3, and wherein a lens that consists of fluoride crystal material of cubic crystallographic structure and whose lens axis runs in the <111>-direction or in an equivalent principal crystallographic has an orientation parameter $DI_L$ of +2.

23. The objective according to claim 20, wherein a homogeneous group consists of n subgroups, where n represents an integer, wherein each subgroup has at least one lens, wherein equivalent principal crystallographic directions of the lenses of a subgroup run in approximately equal directions, and wherein the sum $\Sigma_{HG}(BF_L)$ of the birefringence factors $BF_L$ of the lenses of a homogeneous group and the sum $\Sigma_{UG}(BF_L)$ of the birefringence factors $BF_L$ of the lenses of a subgroup conform to the inequality $0.75 \cdot \Sigma_{HG}(BF_L) < n \cdot \Sigma_{UG}(BF_L) < 1.25 \Sigma_{HG}(BF_L)$.

24. The objective according to claim 12 with a field plane, wherein at least two lenses that are arranged in the light path before and after the field plane form a homogeneous group of first lenses.

25. The objective according to claim 1 with a field plane, wherein at least the lens that is arranged in the light path before and after the field plane is a first lens.

26. The objective according to claim 1, wherein the outer aperture ray has an aperture angle $\theta_L$ and an optical path length $OP_L$ in each of the first and second lenses and wherein in one of the first lenses the multiplication product $OP_L \cdot \sin^2\theta_L$ has its maximum value.

27. The objective according to claim 1, wherein in at least two first lenses the value of the multiplication product $OP_L \cdot \sin^2\theta_L$ is at least 90% of the maximum of all multiplication products $OP_L \cdot \sin^2\theta_L$ occurring in the first and second lenses.

28. The objective according to claim 26, wherein in each second lens the value of the multiplication product $OP_L \cdot \sin^2\theta_L$ is no more than 75% of the maximum of all multiplication products $OP_L \cdot \sin^2\theta_L$ occurring in the first and second lenses.

29. The objective according to claim 1, wherein the objective has a numerical aperture NA on the image side and wherein said numerical aperture NA on the image side is larger than 0.7.

30. The objective according to claim 1, wherein the objective is operable at a working wavelength shorter than 200 nm.

31. The objective according to claim 1, wherein the objective is operable at a working wavelength shorter than 160 nm.

32. The objective according to claim 1, wherein the objective is a purely refractive objective.

33. The objective according to claim 1, wherein all of the lenses of the objective are first lenses or second lenses.

34. The objective according to claim 1 with maximally four first lenses and at least ten second lenses.

35. A microlithography projection apparatus, comprising an illumination system for illuminating a mask carrying a structure, and an objective according claim 1 which projects an image of the structure-carrying mask onto a light-sensitive substrate.

36. The objective of claim 1, wherein the objective is configured for use in a microlithography projection apparatus.

37. The objective of claim 8, wherein the objective is configured for use in a microlithography projection apparatus.

* * * * *

UNITED STATES PATENT AND TRADEMARK OFFICE
CERTIFICATE OF CORRECTION

PATENT NO. : 6,992,834 B2
DATED : January 31, 2006
INVENTOR(S) : Michael Totzeck et al.

It is certified that error appears in the above-identified patent and that said Letters Patent is hereby corrected as shown below:

<u>Title page,</u>
Item [30], should read:
-- Foreign Application Priority Data
Sept. 3, 2002 (DE) ...... 102 41 102.6
Nov. 14, 2002 (DE) ...... 102 53 353.9 --.

Signed and Sealed this

Second Day of May, 2006

JON W. DUDAS
*Director of the United States Patent and Trademark Office*